(12) United States Patent
Tolpygo

(10) Patent No.: US 9,136,457 B2
(45) Date of Patent: Sep. 15, 2015

(54) DOUBLE-MASKING TECHNIQUE FOR INCREASING FABRICATION YIELD IN SUPERCONDUCTING ELECTRONICS

(71) Applicant: Hypres, Inc., Elmsford, NY (US)

(72) Inventor: Sergey K. Tolpygo, Putnam Valley, NY (US)

(73) Assignee: Hypres, Inc., Elmsford, NY (US)

( * ) Notice: Subject to any disclaimer, the term of this patent is extended or adjusted under 35 U.S.C. 154(b) by 138 days.

(21) Appl. No.: 13/771,330

(22) Filed: Feb. 20, 2013

(65) Prior Publication Data

US 2014/0054552 A1    Feb. 27, 2014

Related U.S. Application Data

(60) Continuation of application No. 13/073,954, filed on Mar. 28, 2011, now Pat. No. 8,383,426, which is a continuation of application No. 12/346,603, filed on Dec. 30, 2008, now abandoned, which is a division of application No. 11/616,382, filed on Dec. 27, 2006, now Pat. No. 7,615,385.

(60) Provisional application No. 60/826,262, filed on Sep. 20, 2006.

(51) Int. Cl.
*H01L 29/06* (2006.01)
*H01L 39/02* (2006.01)
*H01L 39/24* (2006.01)

(52) U.S. Cl.
CPC .......... *H01L 39/025* (2013.01); *H01L 39/2493* (2013.01)

(58) Field of Classification Search
CPC ........................ H01L 39/025; H01L 39/2493

USPC .................................................. 257/31; 438/2
See application file for complete search history.

(56) References Cited

U.S. PATENT DOCUMENTS

| | | |
|---|---|---|
| 3,936,809 A | 2/1976 | Zappe |
| 3,943,383 A | 3/1976 | Hamel |
| 3,953,749 A | 4/1976 | Baechtold et al. |
| 3,962,628 A | 6/1976 | Rein |
| 3,970,965 A | 7/1976 | Shapiro et al. |
| 3,976,938 A | 8/1976 | Hesterman |
| 3,978,351 A | 8/1976 | Zappe |
| 3,980,076 A | 9/1976 | Wikswo, Jr. et al. |
| 4,008,411 A | 2/1977 | Brugger et al. |
| 4,009,479 A | 2/1977 | Cardinne et al. |

(Continued)

*Primary Examiner* — Shaun Campbell
(74) *Attorney, Agent, or Firm* — Steven M. Hoffberg, Esq.; Ostrolenk Faber LLP

(57) ABSTRACT

An improved microfabrication technique for Josephson junctions in superconducting integrated circuits, based on the use of a double-layer lithographic mask for partial anodization of the side-walls and base electrode of the junctions. The top layer of the mask is a resist material, and the bottom layer is a dielectric material chosen so to maximize adhesion between the resist and the underlying superconducting layer, be etch-compatible with the underlying superconducting layer, and be insoluble in the resist and anodization processing chemistries. The superconductor is preferably niobium, under a silicon dioxide layer, with a conventional photoresist or electron-beam resist as the top layer. This combination results in a substantial increase in the fabrication yield of high-density superconducting integrated circuits, increase in junction uniformity and reduction in defect density. A dry etch more compatible with microlithography may be employed.

20 Claims, 15 Drawing Sheets

(56) References Cited

U.S. PATENT DOCUMENTS

| | | |
|---|---|---|
| 4,025,844 A | 5/1977 | Deutscher |
| 4,028,714 A | 6/1977 | Henkels |
| 4,039,856 A | 8/1977 | Schlig |
| 4,055,847 A | 10/1977 | Fletcher et al. |
| 4,075,756 A | 2/1978 | Kircher et al. |
| 4,079,730 A | 3/1978 | Wikswo, Jr. et al. |
| 4,082,991 A | 4/1978 | Constant |
| 4,097,765 A | 6/1978 | Zappe |
| 4,107,554 A | 8/1978 | Yao |
| 4,109,522 A | 8/1978 | Thompson |
| 4,117,503 A | 9/1978 | Zappe |
| 4,130,893 A | 12/1978 | Henkels |
| 4,143,520 A | 3/1979 | Zimmerman |
| 4,163,156 A | 7/1979 | Daetwyler et al. |
| 4,176,029 A | 11/1979 | Jillie, Jr. |
| 4,176,365 A | 11/1979 | Kroger |
| 4,177,476 A | 12/1979 | Kroger et al. |
| 4,178,602 A | 12/1979 | Kandyba et al. |
| 4,186,441 A | 1/1980 | Baechtold et al. |
| 4,220,959 A | 9/1980 | Kroger |
| 4,224,630 A | 9/1980 | Kroger |
| 4,225,818 A | 9/1980 | Gallop et al. |
| 4,227,096 A | 10/1980 | Frosch et al. |
| 4,253,230 A | 3/1981 | Davis |
| 4,255,465 A | 3/1981 | Bernard et al. |
| 4,263,603 A | 4/1981 | Jillie, Jr. |
| 4,266,008 A | 5/1981 | Kampwirth et al. |
| 4,280,095 A | 7/1981 | Hinton |
| 4,295,147 A | 10/1981 | Kircher et al. |
| 4,299,679 A | 11/1981 | Suzuki |
| 4,313,066 A | 1/1982 | Gheewala |
| 4,316,200 A | 2/1982 | Ames et al. |
| 4,320,341 A | 3/1982 | Lutes |
| 4,326,188 A | 4/1982 | Dahlberg |
| 4,333,808 A | 6/1982 | Bhattacharyya et al. |
| 4,339,508 A | 7/1982 | Tsuya et al. |
| 4,344,052 A | 8/1982 | Davidson |
| 4,351,712 A | 9/1982 | Cuomo et al. |
| 4,366,494 A | 12/1982 | Ohta |
| 4,368,479 A | 1/1983 | Davis |
| 4,370,359 A | 1/1983 | Fetter et al. |
| 4,386,361 A | 5/1983 | Simmonds |
| 4,392,148 A | 7/1983 | Chang et al. |
| 4,395,813 A | 8/1983 | Roth et al. |
| 4,403,189 A | 9/1983 | Simmonds |
| 4,409,262 A | 10/1983 | Jelks et al. |
| 4,412,902 A | 11/1983 | Michikami et al. |
| 4,414,738 A | 11/1983 | Jelks et al. |
| 4,418,095 A | 11/1983 | Young et al. |
| 4,421,785 A | 12/1983 | Kroger |
| 4,423,430 A | 12/1983 | Hasuo et al. |
| 4,426,268 A | 1/1984 | Cukauskas |
| 4,430,662 A | 2/1984 | Jillie, Jr. et al. |
| 4,430,790 A | 2/1984 | Ohta |
| 4,432,134 A | 2/1984 | Jones et al. |
| 4,434,547 A | 3/1984 | Pascal et al. |
| 4,437,227 A | 3/1984 | Flannery et al. |
| 4,439,269 A | 3/1984 | Cukauskas |
| 4,454,522 A | 6/1984 | de Lozanne |
| 4,456,506 A | 6/1984 | Stein et al. |
| 4,458,409 A | 7/1984 | Latta et al. |
| 4,459,321 A | 7/1984 | Kim |
| 4,470,190 A | 9/1984 | Fulton et al. |
| 4,474,828 A | 10/1984 | Young et al. |
| 4,490,733 A | 12/1984 | Kroger |
| 4,490,901 A | 1/1985 | Clark et al. |
| 4,495,510 A | 1/1985 | Roth et al. |
| 4,498,228 A | 2/1985 | Jillie, Jr. et al. |
| 4,499,119 A | 2/1985 | Smith |
| 4,504,552 A | 3/1985 | Kim |
| 4,514,254 A | 4/1985 | Klepner |
| 4,517,121 A | 5/1985 | Jerome et al. |
| 4,517,253 A | 5/1985 | Rose et al. |
| 4,526,629 A | 7/1985 | Latta et al. |
| 4,536,414 A | 8/1985 | Kroger et al. |
| 4,536,780 A * | 8/1985 | Smith ............................ 257/36 |
| 4,536,781 A | 8/1985 | Kroger |
| 4,544,937 A | 10/1985 | Kroger |
| 4,548,834 A | 10/1985 | Tsuge et al. |
| 4,554,567 A | 11/1985 | Jillie et al. |
| 4,560,435 A | 12/1985 | Brown et al. |
| 4,567,438 A | 1/1986 | Gershenson et al. |
| 4,585,999 A | 4/1986 | Hilbert et al. |
| 4,588,947 A | 5/1986 | Ketchen |
| 4,589,001 A | 5/1986 | Sakai et al. |
| 4,589,961 A | 5/1986 | Gershenson |
| 4,623,804 A | 11/1986 | Goto |
| 4,629,536 A | 12/1986 | Kadin et al. |
| 4,647,954 A | 3/1987 | Graf et al. |
| 4,660,061 A | 4/1987 | Sweeny et al. |
| 4,687,987 A | 8/1987 | Kuchnir et al. |
| 4,689,559 A | 8/1987 | Hastings et al. |
| 4,693,000 A | 9/1987 | Hoenig |
| 4,694,567 A | 9/1987 | Daalmans |
| 4,700,135 A | 10/1987 | Hoenig |
| 4,715,189 A | 12/1987 | Hohenwarter |
| 4,726,890 A | 2/1988 | Thakoor et al. |
| 4,733,180 A | 3/1988 | Hoenig et al. |
| 4,739,633 A | 4/1988 | Faris |
| 4,749,888 A | 6/1988 | Sakai et al. |
| 4,749,946 A | 6/1988 | Hoenig |
| 4,751,563 A | 6/1988 | Laibowitz et al. |
| 4,761,611 A | 8/1988 | Hoenig |
| 4,768,069 A | 8/1988 | Talvacchio et al. |
| 4,777,362 A | 10/1988 | Faris |
| 4,789,794 A | 12/1988 | Whiteley et al. |
| 4,790,903 A | 12/1988 | Sugano et al. |
| 4,801,882 A | 1/1989 | Daalmans |
| 4,812,689 A | 3/1989 | Whiteley |
| 4,844,989 A | 7/1989 | Murduck et al. |
| 4,856,899 A | 8/1989 | Iwaoka et al. |
| 4,857,360 A | 8/1989 | Halbritter et al. |
| 4,859,879 A | 8/1989 | Przybysz |
| 4,860,067 A | 8/1989 | Jackson et al. |
| 4,866,302 A | 9/1989 | Whiteley et al. |
| 4,869,598 A | 9/1989 | McDonald |
| 4,884,111 A | 11/1989 | Nishino et al. |
| 4,893,353 A | 1/1990 | Iwaoka et al. |
| 4,904,341 A | 2/1990 | Blaugher et al. |
| 4,904,619 A | 2/1990 | Yamada et al. |
| 4,904,980 A | 2/1990 | Przybysz et al. |
| 4,906,930 A | 3/1990 | Nakane et al. |
| 4,911,800 A | 3/1990 | Sadoway et al. |
| 4,912,526 A | 3/1990 | Iwaoka et al. |
| 4,918,049 A | 4/1990 | Cohn et al. |
| 4,918,328 A | 4/1990 | Kuo |
| 4,920,093 A | 4/1990 | Nonaka et al. |
| 4,923,850 A | 5/1990 | Stephan et al. |
| 4,927,670 A | 5/1990 | Erbil |
| 4,937,525 A | 6/1990 | Daalmans |
| 4,962,316 A | 10/1990 | Jack |
| 4,963,852 A | 10/1990 | Drehman |
| 4,971,944 A | 11/1990 | Charles et al. |
| 4,974,205 A | 11/1990 | Kotani |
| 4,977,402 A | 12/1990 | Ko |
| 4,983,971 A | 1/1991 | Przybysz et al. |
| 5,001,110 A | 3/1991 | Nonaka et al. |
| 5,012,190 A | 4/1991 | Dossel |
| 5,013,526 A | 5/1991 | Kobayashi et al. |
| 5,019,530 A | 5/1991 | Kleinsasser et al. |
| 5,019,551 A | 5/1991 | Hidaka |
| 5,019,721 A | 5/1991 | Martens et al. |
| 5,021,658 A | 6/1991 | Bluzer |
| 5,021,867 A | 6/1991 | Przybysz |
| 5,024,993 A | 6/1991 | Kroger et al. |
| 5,036,042 A | 7/1991 | Hed |
| 5,041,880 A | 8/1991 | Nojima et al. |
| 5,047,390 A | 9/1991 | Higashino et al. |
| 5,049,818 A | 9/1991 | Dossel et al. |
| 5,053,834 A | 10/1991 | Simmonds |
| 5,055,158 A | 10/1991 | Gallagher et al. |
| 5,055,319 A | 10/1991 | Bunshah et al. |
| 5,058,431 A | 10/1991 | Karwacki |
| 5,064,809 A | 11/1991 | Hed |

(56) References Cited

U.S. PATENT DOCUMENTS

| | | |
|---|---|---|
| 5,065,096 A | 11/1991 | Muck et al. |
| 5,068,694 A | 11/1991 | Ohara |
| 5,069,748 A | 12/1991 | Przybysz |
| 5,073,209 A | 12/1991 | Giancola |
| 5,075,282 A | 12/1991 | Koinuma et al. |
| 5,075,283 A | 12/1991 | De |
| 5,075,736 A | 12/1991 | Wada |
| 5,087,605 A | 2/1992 | Hegde et al. |
| 5,096,882 A | 3/1992 | Kato et al. |
| 5,099,152 A | 3/1992 | Suzuki |
| 5,102,862 A | 4/1992 | Okabe et al. |
| 5,106,820 A | 4/1992 | Ogushi et al. |
| 5,106,823 A | 4/1992 | Creuzet et al. |
| 5,109,164 A | 4/1992 | Matsui |
| 5,114,912 A | 5/1992 | Benz |
| 5,116,811 A | 5/1992 | Abe et al. |
| 5,123,974 A | 6/1992 | Giancola |
| 5,124,583 A | 6/1992 | Hatano et al. |
| 5,126,801 A | 6/1992 | Nishino et al. |
| 5,131,976 A | 7/1992 | Hoko |
| 5,132,278 A | 7/1992 | Stevens et al. |
| 5,134,117 A | 7/1992 | Dilorio et al. |
| 5,142,229 A | 8/1992 | Marsden |
| 5,143,894 A | 9/1992 | Rothschild et al. |
| 5,151,409 A | 9/1992 | Hiratani et al. |
| 5,153,171 A | 10/1992 | Smith et al. |
| 5,155,094 A | 10/1992 | Okabe et al. |
| 5,158,932 A | 10/1992 | Hinshaw et al. |
| 5,162,731 A | 11/1992 | Fujimaki |
| 5,164,696 A | 11/1992 | Kotani |
| 5,166,614 A | 11/1992 | Yokosawa et al. |
| 5,173,606 A | 12/1992 | Weinberger et al. |
| 5,173,660 A | 12/1992 | Marsden |
| 5,175,140 A | 12/1992 | Fujita et al. |
| 5,189,420 A | 2/1993 | Eddy et al. |
| 5,198,412 A | 3/1993 | Nagesh et al. |
| 5,198,815 A | 3/1993 | Przybysz et al. |
| 5,202,630 A | 4/1993 | Marsden |
| 5,219,826 A | 6/1993 | Kapitulnik |
| 5,229,361 A | 7/1993 | Shiraishi et al. |
| 5,231,073 A | 7/1993 | Cohn et al. |
| 5,231,079 A | 7/1993 | Giancola |
| 5,240,906 A | 8/1993 | Bednorz et al. |
| 5,250,817 A | 10/1993 | Fink |
| 5,253,199 A | 10/1993 | Gibson |
| 5,254,950 A | 10/1993 | Fan et al. |
| 5,256,636 A | 10/1993 | Wellstood et al. |
| 5,266,558 A | 11/1993 | Lichtenberg et al. |
| 5,268,577 A | 12/1993 | Artuso et al. |
| 5,272,480 A | 12/1993 | Lee |
| 5,279,852 A | 1/1994 | Clough et al. |
| 5,280,013 A | 1/1994 | Newman et al. |
| 5,280,241 A | 1/1994 | Ueda et al. |
| 5,286,336 A | 2/1994 | Chan et al. |
| 5,286,712 A | 2/1994 | Fujita et al. |
| 5,291,035 A | 3/1994 | Wellstood et al. |
| 5,291,274 A | 3/1994 | Tamura |
| 5,298,875 A | 3/1994 | Laibowitz et al. |
| 5,300,487 A | 4/1994 | Hed |
| 5,304,817 A | 4/1994 | Ishida |
| 5,306,705 A | 4/1994 | Holcomb et al. |
| 5,306,927 A | 4/1994 | Dalrymple et al. |
| 5,310,706 A | 5/1994 | Litchenberg et al. |
| 5,311,020 A | 5/1994 | Silver et al. |
| 5,311,036 A | 5/1994 | Nishino et al. |
| 5,313,074 A | 5/1994 | Tamura et al. |
| 5,317,168 A | 5/1994 | Nishino et al. |
| 5,319,307 A | 6/1994 | Simmonds |
| 5,321,276 A | 6/1994 | Kurakado et al. |
| 5,323,344 A | 6/1994 | Katayama et al. |
| 5,326,988 A | 7/1994 | Ishida |
| 5,331,297 A | 7/1994 | Kubo et al. |
| 5,336,941 A | 8/1994 | Ishida |
| 5,339,457 A | 8/1994 | Kawasaki et al. |
| 5,339,811 A | 8/1994 | Ohta et al. |
| 5,346,882 A | 9/1994 | Muller |
| 5,347,086 A | 9/1994 | Potter et al. |
| 5,348,797 A | 9/1994 | Clough et al. |
| 5,356,833 A | 10/1994 | Maniar et al. |
| 5,362,710 A | 11/1994 | Fujita et al. |
| 5,365,476 A | 11/1994 | Mukhanov |
| 5,367,178 A | 11/1994 | Dilorio et al. |
| 5,388,068 A | 2/1995 | Ghoshal et al. |
| 5,398,030 A | 3/1995 | Sandell |
| 5,401,530 A | 3/1995 | Tamura et al. |
| 5,406,847 A | 4/1995 | Rowe et al. |
| 5,420,100 A | 5/1995 | Vittoria et al. |
| 5,420,586 A | 5/1995 | Radparvar |
| 5,424,656 A | 6/1995 | Gibson et al. |
| 5,432,149 A | 7/1995 | Schuller et al. |
| 5,434,530 A | 7/1995 | Ghoshal et al. |
| 5,436,451 A | 7/1995 | Silver et al. |
| 5,436,471 A | 7/1995 | Hoko |
| 5,442,195 A | 8/1995 | Saitoh et al. |
| 5,442,196 A | 8/1995 | Nishino et al. |
| 5,442,289 A | 8/1995 | Dilorio et al. |
| 5,449,952 A | 9/1995 | Kataoka et al. |
| 5,451,871 A | 9/1995 | Igarashi et al. |
| 5,453,691 A | 9/1995 | David et al. |
| 5,462,762 A | 10/1995 | Onuma et al. |
| 5,472,934 A | 12/1995 | Akoh et al. |
| 5,474,834 A | 12/1995 | Tanahashi et al. |
| 5,476,719 A | 12/1995 | Sandell et al. |
| 5,477,061 A | 12/1995 | Morohashi |
| 5,479,131 A | 12/1995 | Lee |
| 5,480,859 A | 1/1996 | Mizuno et al. |
| 5,481,119 A | 1/1996 | Higashino et al. |
| 5,493,719 A | 2/1996 | Smith et al. |
| 5,506,200 A | 4/1996 | Hirschkoff et al. |
| 5,506,497 A | 4/1996 | Klein et al. |
| 5,523,686 A | 6/1996 | Kirtley et al. |
| 5,532,485 A | 7/1996 | Bluzer et al. |
| 5,552,373 A | 9/1996 | Agostinelli et al. |
| 5,567,523 A | 10/1996 | Rosenblum et al. |
| 5,574,369 A | 11/1996 | Hibbs |
| 5,578,554 A | 11/1996 | Akimitsu et al. |
| 5,582,877 A | 12/1996 | Nagamachi et al. |
| 5,595,959 A | 1/1997 | Dilorio et al. |
| 5,600,242 A | 2/1997 | Hubbell |
| 5,600,243 A | 2/1997 | Colclough |
| 5,603,983 A | 2/1997 | Clough et al. |
| 5,614,471 A | 3/1997 | Ohkura et al. |
| 5,618,446 A | 4/1997 | Nagaishi |
| 5,627,139 A | 5/1997 | Chin et al. |
| 5,640,010 A | 6/1997 | Twerenbold |
| 5,656,937 A | 8/1997 | Cantor |
| 5,661,112 A | 8/1997 | Hatta et al. |
| 5,665,980 A | 9/1997 | Onuma et al. |
| 5,710,437 A | 1/1998 | Kurakado et al. |
| 5,721,197 A | 2/1998 | Downar et al. |
| 5,747,873 A | 5/1998 | Talisa et al. |
| 5,753,935 A | 5/1998 | Kurakado et al. |
| 5,756,207 A | 5/1998 | Clough et al. |
| 5,764,048 A | 6/1998 | Yoshida |
| 5,767,043 A | 6/1998 | Cantor et al. |
| 5,768,002 A | 6/1998 | Puzey |
| 5,776,359 A | 7/1998 | Schultz et al. |
| 5,781,009 A | 7/1998 | Lee et al. |
| 5,786,690 A | 7/1998 | Kirtley et al. |
| 5,793,055 A | 8/1998 | Kastalsky |
| 5,795,849 A | 8/1998 | Hickman |
| 5,818,373 A | 10/1998 | Semenov et al. |
| 5,821,557 A | 10/1998 | Nagamachi et al. |
| 5,838,530 A | 11/1998 | Zhang |
| 5,844,407 A | 12/1998 | Hubbell |
| 5,866,195 A | 2/1999 | Lemelson |
| 5,869,846 A | 2/1999 | Higashino et al. |
| 5,873,985 A | 2/1999 | Tokunaga et al. |
| 5,877,124 A | 3/1999 | Yamazaki |
| 5,880,069 A | 3/1999 | Nakao et al. |
| 5,885,937 A | 3/1999 | Adachi et al. |
| 5,886,809 A | 3/1999 | Puzey |
| 5,897,367 A | 4/1999 | Kerber et al. |
| 5,909,086 A | 6/1999 | Kim et al. |

(56) References Cited

U.S. PATENT DOCUMENTS

| | | |
|---|---|---|
| 5,912,503 A | 6/1999 | Chan et al. |
| 5,933,001 A | 8/1999 | Hubbell |
| 5,939,895 A | 8/1999 | Smith |
| 5,942,997 A | 8/1999 | Silver et al. |
| 5,955,400 A | 9/1999 | Yokosawa et al. |
| 5,962,865 A | 10/1999 | Kerber et al. |
| 5,962,866 A | 10/1999 | Dilorio et al. |
| 5,963,351 A | 10/1999 | Kaplounenko et al. |
| 5,965,900 A | 10/1999 | Peacock et al. |
| 5,985,356 A | 11/1999 | Schultz et al. |
| 5,994,694 A | 11/1999 | Frank et al. |
| 5,994,891 A | 11/1999 | Hubbell |
| 5,998,336 A | 12/1999 | Holcomb |
| 5,998,337 A | 12/1999 | Hatta et al. |
| 6,004,617 A | 12/1999 | Schultz et al. |
| 6,005,380 A | 12/1999 | Hubbell |
| 6,008,642 A | 12/1999 | Bulsara et al. |
| 6,033,678 A | 3/2000 | Lorenzen |
| 6,045,626 A | 4/2000 | Yano et al. |
| 6,051,440 A | 4/2000 | Chan et al. |
| 6,060,220 A | 5/2000 | Snortland |
| 6,060,664 A | 5/2000 | Tanahashi et al. |
| 6,083,885 A | 7/2000 | Weinstein |
| 6,090,617 A | 7/2000 | Meserol |
| RE36,814 E | 8/2000 | Hatta et al. |
| 6,110,392 A | 8/2000 | Kerber et al. |
| 6,115,170 A | 9/2000 | Puzey |
| 6,154,026 A | 11/2000 | Dantsker et al. |
| 6,157,329 A | 12/2000 | Lee et al. |
| 6,159,444 A | 12/2000 | Schlenga et al. |
| 6,169,397 B1 | 1/2001 | Steinbach et al. |
| 6,188,084 B1 | 2/2001 | Kerber et al. |
| 6,265,019 B1 | 7/2001 | Bianconi |
| 6,285,487 B1 | 9/2001 | Puzey |
| 6,326,090 B1 | 12/2001 | Schultz et al. |
| 6,332,322 B1 | 12/2001 | Tanaka |
| 6,346,290 B1 | 2/2002 | Schultz et al. |
| 6,357,912 B1 | 3/2002 | Li |
| 6,362,617 B1 | 3/2002 | Hubbell |
| 6,365,912 B1 | 4/2002 | Booth et al. |
| 6,384,423 B1 | 5/2002 | Kerber et al. |
| 6,404,615 B1 | 6/2002 | Wijeyesekera et al. |
| 6,410,331 B1 | 6/2002 | Schultz et al. |
| 6,414,870 B1 | 7/2002 | Johnson et al. |
| 6,420,179 B1 | 7/2002 | Schultz et al. |
| 6,420,251 B1 | 7/2002 | Elmadjian et al. |
| 6,436,317 B1 | 8/2002 | Malozemoff et al. |
| 6,459,097 B1 | 10/2002 | Zagoskin |
| 6,476,413 B1 | 11/2002 | Jia et al. |
| 6,476,956 B1 | 11/2002 | Cottrell et al. |
| 6,483,339 B1 | 11/2002 | Durand et al. |
| 6,485,961 B1 | 11/2002 | Meserol |
| 6,495,854 B1 | 12/2002 | Newns et al. |
| 6,504,172 B2 | 1/2003 | Zagoskin et al. |
| 6,509,853 B2 | 1/2003 | Gupta |
| 6,514,557 B2 | 2/2003 | Finnemore et al. |
| 6,515,788 B2 | 2/2003 | Puzey |
| 6,518,673 B2 | 2/2003 | Herr et al. |
| 6,525,002 B2 | 2/2003 | Weinstein |
| 6,528,814 B1 | 3/2003 | Frank et al. |
| 6,537,847 B2 | 3/2003 | Zagoskin et al. |
| 6,552,537 B2 | 4/2003 | Odawara |
| 6,563,310 B2 | 5/2003 | Zagoskin |
| 6,563,311 B2 | 5/2003 | Zagoskin |
| 6,569,811 B1 | 5/2003 | Shi |
| 6,573,202 B2 | 6/2003 | Ivanov et al. |
| 6,576,951 B2 | 6/2003 | Ivanov et al. |
| 6,580,102 B2 | 6/2003 | Ivanov et al. |
| 6,580,310 B2 | 6/2003 | Herr |
| 6,591,119 B2 | 7/2003 | Finnemore et al. |
| 6,605,822 B1 | 8/2003 | Blais et al. |
| 6,614,047 B2 | 9/2003 | Tzalenchuk et al. |
| 6,627,915 B1 | 9/2003 | Ustinov et al. |
| 6,642,608 B1 | 11/2003 | Hu |
| 6,649,413 B1 | 11/2003 | Schultz et al. |
| 6,649,929 B2 | 11/2003 | Newns et al. |
| 6,650,107 B2 | 11/2003 | Bakharev |
| 6,664,562 B2 | 12/2003 | Weiss et al. |
| 6,670,630 B2 | 12/2003 | Blais et al. |
| 6,678,540 B2 | 1/2004 | Wire et al. |
| 6,686,205 B1 | 2/2004 | Schultz et al. |
| 6,690,162 B1 | 2/2004 | Schopohl et al. |
| 6,710,334 B1 | 3/2004 | Twerenbold |
| 6,713,173 B2 | 3/2004 | Mayes et al. |
| 6,728,131 B2 | 4/2004 | Ustinov |
| 6,734,454 B2 | 5/2004 | Van Duzer et al. |
| 6,753,546 B2 | 6/2004 | Tzalenchuk et al. |
| 6,754,108 B2 | 6/2004 | Forbes |
| 6,773,669 B1 | 8/2004 | Holaday et al. |
| 6,777,808 B2 | 8/2004 | Herr et al. |
| 6,778,441 B2 | 8/2004 | Forbes et al. |
| 6,784,451 B2 | 8/2004 | Amin et al. |
| 6,791,109 B2 | 9/2004 | Tzalenchuk et al. |
| 6,794,052 B2 | 9/2004 | Schultz et al. |
| 6,797,341 B2 | 9/2004 | Zeng et al. |
| 6,803,599 B2 | 10/2004 | Amin et al. |
| 6,812,039 B1 | 11/2004 | Kohlstedt et al. |
| 6,812,484 B2 | 11/2004 | Tzalenchuk et al. |
| 6,815,063 B1 | 11/2004 | Mayes |
| 6,815,949 B2 | 11/2004 | Kandori et al. |
| 6,822,255 B2 | 11/2004 | Tzalenchuk et al. |
| 6,835,696 B2 | 12/2004 | Saito et al. |
| 6,835,949 B2 | 12/2004 | Weiss et al. |
| 6,836,141 B2 | 12/2004 | Herr |
| 6,838,404 B2 | 1/2005 | Hentges et al. |
| 6,838,694 B2 | 1/2005 | Esteve et al. |
| 6,853,049 B2 | 2/2005 | Herner |
| 6,853,185 B2 | 2/2005 | Tsukamoto et al. |
| 6,864,201 B2 | 3/2005 | Schultz et al. |
| 6,869,915 B2 | 3/2005 | Weinstein |
| 6,882,293 B2 | 4/2005 | Shoji et al. |
| 6,885,192 B2 | 4/2005 | Clarke et al. |
| 6,885,325 B2 | 4/2005 | Omelyanchouk et al. |
| 6,896,957 B1 | 5/2005 | Mayes et al. |
| 6,897,468 B2 | 5/2005 | Blais et al. |
| 6,900,454 B2 | 5/2005 | Blais et al. |
| 6,900,456 B2 | 5/2005 | Blais et al. |
| 6,911,664 B2 | 6/2005 | Il'ichev et al. |
| 6,911,665 B2 | 6/2005 | Aoyagi et al. |
| 6,917,216 B2 | 7/2005 | Herr |
| 6,919,579 B2 | 7/2005 | Amin et al. |
| 6,922,066 B2 | 7/2005 | Hidaka |
| 6,926,921 B2 | 8/2005 | Stasiak et al. |
| 6,930,318 B2 | 8/2005 | Vion et al. |
| 6,930,320 B2 | 8/2005 | Blais et al. |
| 6,936,841 B2 | 8/2005 | Amin et al. |
| 6,943,368 B2 | 9/2005 | Amin et al. |
| 6,946,428 B2 | 9/2005 | Rey |
| 6,951,985 B1 | 10/2005 | Lemelson |
| 6,952,032 B2 | 10/2005 | Forbes et al. |
| 6,955,835 B2 | 10/2005 | Fartash |
| 6,958,122 B1 | 10/2005 | Gidner et al. |
| 6,958,487 B2 | 10/2005 | Irie et al. |
| 6,958,937 B2 | 10/2005 | Forbes |
| 6,960,780 B2 | 11/2005 | Blais et al. |
| 6,961,597 B1 | 11/2005 | Agassi |
| 6,963,103 B2 | 11/2005 | Forbes |
| 6,979,836 B2 | 12/2005 | Zagoskin et al. |
| 6,986,942 B1 | 1/2006 | Mayes |
| 6,987,282 B2 | 1/2006 | Amin et al. |
| 7,002,174 B2 | 2/2006 | Il'ichev et al. |
| 7,002,341 B2 | 2/2006 | Baudenbacher et al. |
| 7,015,499 B1 | 3/2006 | Zagoskin |
| 7,019,372 B2 | 3/2006 | Goldie |
| 7,026,271 B1 | 4/2006 | Weinstein |
| 7,027,328 B2 | 4/2006 | Forbes et al. |
| 7,029,916 B2 | 4/2006 | Dzekunov et al. |
| 7,034,091 B2 | 4/2006 | Schultz et al. |
| 7,038,604 B2 | 5/2006 | Hirano et al. |
| 7,042,005 B2 | 5/2006 | Il'ichev et al. |
| 7,042,043 B2 | 5/2006 | Forbes et al. |
| 7,053,610 B2 | 5/2006 | Clarke et al. |
| 7,060,508 B2 | 6/2006 | Kerber |
| 7,068,544 B2 | 6/2006 | Forbes et al. |

(56) References Cited

U.S. PATENT DOCUMENTS

| | | |
|---|---|---|
| 7,074,673 B2 | 7/2006 | Forbes |
| 7,075,829 B2 | 7/2006 | Forbes |
| 7,081,417 B2 | 7/2006 | Hinode et al. |
| 7,087,954 B2 | 8/2006 | Forbes |
| 7,090,889 B2 | 8/2006 | Liu et al. |
| 7,095,227 B2 | 8/2006 | Tarutani et al. |
| 7,105,853 B2 | 9/2006 | Kerber |
| 7,112,841 B2 | 9/2006 | Eldridge et al. |
| 7,116,094 B2 | 10/2006 | Levin et al. |
| 7,116,102 B2 | 10/2006 | Clarke et al. |
| 7,126,183 B2 | 10/2006 | Forbes et al. |
| 7,129,870 B2 | 10/2006 | Hirano et al. |
| 7,132,711 B2 | 11/2006 | Forbes et al. |
| 7,135,701 B2 | 11/2006 | Amin et al. |
| 7,135,734 B2 | 11/2006 | Eldridge et al. |
| 7,136,302 B2 | 11/2006 | Forbes et al. |
| 7,141,425 B2 | 11/2006 | Dzekunov et al. |
| 7,153,567 B1 | 12/2006 | Akedo et al. |
| 7,166,886 B2 | 1/2007 | Forbes |
| 7,186,559 B2 | 3/2007 | Dzekunov et al. |
| 7,187,169 B2 | 3/2007 | Clarke et al. |
| 7,187,587 B2 | 3/2007 | Forbes |
| 7,189,425 B2 | 3/2007 | Kang et al. |
| 7,218,104 B2 | 5/2007 | Clarke et al. |
| 7,221,586 B2 | 5/2007 | Forbes et al. |
| 7,247,603 B2 | 7/2007 | Cantor et al. |
| 7,253,654 B2 | 8/2007 | Amin |
| 7,253,701 B2 | 8/2007 | Smith et al. |
| 7,255,934 B2 | 8/2007 | Hatono et al. |
| 7,263,034 B2 | 8/2007 | Ramenzoni |
| 7,268,576 B2 | 9/2007 | Amin |
| 7,268,713 B2 | 9/2007 | Suzuki et al. |
| 7,274,067 B2 | 9/2007 | Forbes |
| 7,318,967 B2 | 1/2008 | Hatono et al. |
| 7,323,348 B2 | 1/2008 | Aoyagi et al. |
| 7,329,565 B2 | 2/2008 | Herner |
| 7,332,738 B2 | 2/2008 | Blais et al. |
| 7,335,909 B2 | 2/2008 | Amin et al. |
| 7,338,921 B2 | 3/2008 | Abe et al. |
| 7,342,396 B2 | 3/2008 | Pannetier et al. |
| 7,365,534 B2 | 4/2008 | Tralshawala et al. |
| 7,365,663 B2 | 4/2008 | Rylov et al. |
| 7,369,093 B2 | 5/2008 | Oppenlander et al. |
| 7,372,096 B2 | 5/2008 | Forbes et al. |
| 7,372,097 B2 | 5/2008 | Forbes et al. |
| 7,391,072 B2 | 6/2008 | Forbes et al. |
| 7,393,699 B2 | 7/2008 | Tran |
| 7,418,283 B2 | 8/2008 | Amin |
| 7,433,237 B2 | 10/2008 | Forbes et al. |
| 7,440,490 B2 | 10/2008 | Kidiyarova-Shevchenko et al. |
| 7,442,665 B2 | 10/2008 | Schultz et al. |
| 7,443,715 B2 | 10/2008 | Forbes |
| 7,443,719 B2 | 10/2008 | Kirichenko et al. |
| 7,446,368 B2 | 11/2008 | Eldridge et al. |
| 7,450,299 B2 | 11/2008 | Takizawa et al. |
| 7,465,983 B2 | 12/2008 | Eldridge et al. |
| 7,466,132 B2 | 12/2008 | Clarke et al. |
| 7,473,956 B2 | 1/2009 | Eldridge et al. |
| 7,476,925 B2 | 1/2009 | Eldridge et al. |
| 7,501,877 B2 | 3/2009 | Furuta et al. |
| 7,504,687 B2 | 3/2009 | Eldridge et al. |
| 7,505,310 B2 | 3/2009 | Nagasawa et al. |
| 7,508,025 B2 | 3/2009 | Eldridge et al. |
| 7,521,708 B1 | 4/2009 | Agassi |
| 7,533,068 B2 | 5/2009 | Maassen van den Brink et al. |
| 7,544,964 B2 | 6/2009 | Kawakami |
| 7,545,674 B2 | 6/2009 | Forbes et al. |
| 7,550,759 B2 | 6/2009 | Hakonen et al. |
| 7,553,376 B2 | 6/2009 | Akedo et al. |
| 7,560,160 B2 | 7/2009 | Sudarshan et al. |
| 7,598,897 B2 | 10/2009 | Kirichenko |
| 7,605,600 B2 | 10/2009 | Harris |
| 7,613,764 B1 | 11/2009 | Hilton et al. |
| 7,613,765 B1 | 11/2009 | Hilton et al. |
| 7,615,385 B2 | 11/2009 | Tolpygo |
| 7,619,437 B2 | 11/2009 | Thom et al. |
| 7,624,088 B2 | 11/2009 | Johnson et al. |
| 7,632,353 B2 | 12/2009 | Hatono et al. |
| 7,655,509 B2 | 2/2010 | Herner |
| 7,687,938 B2 | 3/2010 | Bunyk et al. |
| 7,709,418 B1 | 5/2010 | Chu |
| 7,718,964 B2 | 5/2010 | Frey |
| 7,728,626 B2 | 6/2010 | Forbes et al. |
| 7,733,253 B2 | 6/2010 | Kirichenko |
| 7,736,731 B2 | 6/2010 | Akedo et al. |
| 7,749,922 B2 | 7/2010 | Bezryadin et al. |
| 7,759,724 B2 | 7/2010 | Forbes |
| 7,761,125 B1 | 7/2010 | Agassi et al. |
| 7,763,854 B2 | 7/2010 | Frey |
| 7,767,627 B1 | 8/2010 | Goldwasser et al. |
| 7,771,984 B2 | 8/2010 | Dzekunov et al. |
| 7,788,192 B2 | 8/2010 | Amin |
| 7,791,065 B2 | 9/2010 | Frey et al. |
| 7,798,388 B2 | 9/2010 | Crockett et al. |
| 7,800,395 B2 | 9/2010 | Johnson et al. |
| 7,843,209 B2 | 11/2010 | Berkley |
| 7,844,656 B2 | 11/2010 | Macready et al. |
| 7,847,615 B2 | 12/2010 | Yorozu et al. |
| 7,863,892 B2 | 1/2011 | Morley et al. |
| 7,870,087 B2 | 1/2011 | Macready et al. |
| 7,876,248 B2 | 1/2011 | Berkley et al. |
| 7,876,869 B1 | 1/2011 | Gupta |
| 7,877,333 B2 | 1/2011 | Macready |
| 7,880,529 B2 | 2/2011 | Amin |
| 7,898,282 B2 | 3/2011 | Harris et al. |
| 7,899,852 B2 | 3/2011 | Amin |
| 7,903,456 B2 | 3/2011 | Kirichenko et al. |
| 7,915,095 B2 | 3/2011 | Herner |
| 7,928,386 B2 | 4/2011 | Frey et al. |
| 7,928,875 B2 | 4/2011 | Kirichenko |
| 7,932,515 B2 | 4/2011 | Bunyk |
| 7,969,805 B2 | 6/2011 | Thom et al. |
| 7,977,668 B2 | 7/2011 | Nevirkovets et al. |
| 7,984,012 B2 | 7/2011 | Coury et al. |
| 7,990,662 B2 | 8/2011 | Berkley et al. |
| 7,991,013 B2 | 8/2011 | Gupta et al. |
| 7,991,814 B2 | 8/2011 | Filippov et al. |
| 7,993,701 B2 | 8/2011 | Akedo et al. |
| 8,008,942 B2 | 8/2011 | van den Brink et al. |
| 8,008,991 B2 | 8/2011 | Tcaciuc et al. |
| 8,018,244 B2 | 9/2011 | Berkley |
| 8,032,474 B2 | 10/2011 | Macready et al. |
| 8,033,184 B2 | 10/2011 | Choi et al. |
| 8,035,540 B2 | 10/2011 | Berkley et al. |
| 8,045,660 B1 | 10/2011 | Gupta |
| 8,055,235 B1 | 11/2011 | Gupta et al. |
| 8,055,318 B1 | 11/2011 | Kadin |
| 8,060,169 B1 | 11/2011 | Bednorz et al. |
| 8,063,657 B2 | 11/2011 | Rose |
| 8,073,808 B2 | 12/2011 | Rose |
| 8,098,179 B2 | 1/2012 | Bunyk et al. |
| 8,102,185 B2 | 1/2012 | Johansson et al. |
| 8,124,426 B2 | 2/2012 | Gaidis |
| 8,130,880 B1 | 3/2012 | Gupta |
| 8,159,313 B2 | 4/2012 | Uchaykin |
| 8,159,825 B1 | 4/2012 | Dotsenko |
| 8,169,231 B2 | 5/2012 | Berkley |
| 8,175,995 B2 | 5/2012 | Amin |
| 8,179,133 B1 | 5/2012 | Kornev et al. |
| 8,190,548 B2 | 5/2012 | Choi |
| 8,195,596 B2 | 6/2012 | Rose et al. |
| 8,195,726 B2 | 6/2012 | Macready et al. |
| 8,198,956 B2 | 6/2012 | U-Yen et al. |
| 8,200,304 B2 | 6/2012 | Maeda et al. |
| 8,211,276 B2 | 7/2012 | Adams |
| 8,220,440 B2 | 7/2012 | Adams |
| 8,228,688 B2 | 7/2012 | Uchaykin et al. |
| 8,228,725 B2 | 7/2012 | Forbes et al. |
| 8,229,863 B2 | 7/2012 | Amin et al. |
| 8,234,103 B2 | 7/2012 | Biamonte et al. |
| 8,244,650 B2 | 8/2012 | Rose |
| 8,244,662 B2 | 8/2012 | Coury et al. |
| 8,247,799 B2 | 8/2012 | Bunyk et al. |
| 8,249,540 B1 | 8/2012 | Gupta et al. |

(56) References Cited

U.S. PATENT DOCUMENTS

| | | |
|---|---|---|
| 8,260,143 B2 | 9/2012 | Gupta et al. |
| 8,260,144 B2 | 9/2012 | Gupta et al. |
| 8,260,145 B2 | 9/2012 | Gupta et al. |
| 8,270,209 B2 | 9/2012 | Herr et al. |
| 8,273,610 B2 | 9/2012 | Or-Bach et al. |
| 8,283,943 B2 | 10/2012 | van den Brink et al. |
| 8,285,351 B2 | 10/2012 | Johnson et al. |
| 8,301,104 B1 | 10/2012 | Gupta et al. |
| 8,301,214 B1 | 10/2012 | Tolpygo et al. |
| 8,324,734 B2 | 12/2012 | Gaidis |
| 8,346,325 B2 | 1/2013 | Thom et al. |
| 8,350,568 B2 | 1/2013 | Hwang et al. |
| 8,362,220 B2 | 1/2013 | Girolami et al. |
| 8,383,426 B1 | 2/2013 | Tolpygo |
| 8,386,554 B2 | 2/2013 | Macready et al. |
| 8,401,509 B1 | 3/2013 | Gupta et al. |
| 8,401,600 B1 | 3/2013 | Filippov et al. |
| 8,405,468 B2 | 3/2013 | Uchaykin |
| 8,412,292 B2 | 4/2013 | Agassi et al. |
| 8,421,053 B2 | 4/2013 | Bunyk et al. |
| 8,437,818 B1 | 5/2013 | Tolpygo et al. |
| 8,441,329 B2 | 5/2013 | Thom et al. |
| 8,462,889 B2 | 6/2013 | Gupta |
| 8,494,993 B2 | 7/2013 | Harris et al. |
| 8,504,497 B2 | 8/2013 | Amin |
| 8,514,986 B2 | 8/2013 | Gupta |
| 8,521,117 B1 | 8/2013 | Gupta et al. |
| 8,529,855 B2 | 9/2013 | Chew |
| 8,536,566 B2 | 9/2013 | Johansson et al. |
| 8,560,282 B2 | 10/2013 | Macready et al. |
| 8,560,470 B2 | 10/2013 | Amin et al. |
| 8,565,345 B2 | 10/2013 | Gupta |
| 8,569,468 B2 | 10/2013 | Chen et al. |
| 8,575,544 B1 | 11/2013 | Kelly et al. |
| 8,593,141 B1 | 11/2013 | Radparvar et al. |
| 8,604,944 B2 | 12/2013 | Berkley et al. |
| 8,611,974 B2 | 12/2013 | Maibaum et al. |
| 8,618,799 B1 | 12/2013 | Radparvar et al. |
| 2001/0020701 A1 | 9/2001 | Zagoskin |
| 2001/0023943 A1 | 9/2001 | Zagoskin |
| 2001/0055669 A1 | 12/2001 | Schultz et al. |
| 2001/0055775 A1 | 12/2001 | Schultz et al. |
| 2002/0001121 A1 | 1/2002 | Puzey |
| 2002/0060635 A1 | 5/2002 | Gupta |
| 2002/0089739 A1 | 7/2002 | Takizawa et al. |
| 2002/0097047 A1 | 7/2002 | Odawara |
| 2002/0105948 A1 | 8/2002 | Glomb |
| 2002/0117656 A1 | 8/2002 | Amin et al. |
| 2002/0117738 A1 | 8/2002 | Amin et al. |
| 2002/0119243 A1 | 8/2002 | Schultz et al. |
| 2002/0121636 A1 | 9/2002 | Amin et al. |
| 2002/0130313 A1 | 9/2002 | Zagoskin et al. |
| 2002/0130315 A1 | 9/2002 | Zagoskin et al. |
| 2002/0132739 A1 | 9/2002 | Kang et al. |
| 2002/0149830 A1 | 10/2002 | Cottrell et al. |
| 2002/0180006 A1 | 12/2002 | Franz et al. |
| 2002/0188578 A1 | 12/2002 | Amin et al. |
| 2002/0190381 A1 | 12/2002 | Herr et al. |
| 2003/0016010 A1 | 1/2003 | Kandori et al. |
| 2003/0027724 A1 | 2/2003 | Rose et al. |
| 2003/0039138 A1 | 2/2003 | Herr |
| 2003/0040440 A1 | 2/2003 | Wire et al. |
| 2003/0042481 A1 | 3/2003 | Tzalenchuk et al. |
| 2003/0042527 A1 | 3/2003 | Forbes et al. |
| 2003/0043630 A1 | 3/2003 | Forbes et al. |
| 2003/0043633 A1 | 3/2003 | Forbes et al. |
| 2003/0048666 A1 | 3/2003 | Eldridge et al. |
| 2003/0068832 A1 | 4/2003 | Koval et al. |
| 2003/0071258 A1 | 4/2003 | Zagoskin et al. |
| 2003/0094606 A1 | 5/2003 | Newns et al. |
| 2003/0102470 A1 | 6/2003 | Il'ichev et al. |
| 2003/0107033 A1 | 6/2003 | Tzalenchuk et al. |
| 2003/0111659 A1 | 6/2003 | Tzalenchuk et al. |
| 2003/0111661 A1 | 6/2003 | Tzalenchuk et al. |
| 2003/0128919 A1 | 7/2003 | Weiss et al. |
| 2003/0130127 A1 | 7/2003 | Hentges et al. |
| 2003/0134089 A1 | 7/2003 | Schultz et al. |
| 2003/0141868 A1 | 7/2003 | Bakharev |
| 2003/0146429 A1 | 8/2003 | Tzalenchuk et al. |
| 2003/0146430 A1 | 8/2003 | Tzalenchuk et al. |
| 2003/0173498 A1 | 9/2003 | Blais et al. |
| 2003/0173997 A1 | 9/2003 | Blais et al. |
| 2003/0183935 A1 | 10/2003 | Herr et al. |
| 2003/0193097 A1 | 10/2003 | Il'ichev et al. |
| 2003/0207766 A1 | 11/2003 | Esteve et al. |
| 2003/0209706 A1 | 11/2003 | Irie et al. |
| 2003/0219911 A1 | 11/2003 | Zeng et al. |
| 2003/0224944 A1 | 12/2003 | Il'ichev et al. |
| 2004/0012407 A1 | 1/2004 | Amin et al. |
| 2004/0014077 A1 | 1/2004 | Schultz et al. |
| 2004/0016918 A1 | 1/2004 | Amin et al. |
| 2004/0026030 A1 | 2/2004 | Hatono et al. |
| 2004/0027125 A1 | 2/2004 | Clarke et al. |
| 2004/0056335 A1 | 3/2004 | Aoyagi et al. |
| 2004/0077503 A1 | 4/2004 | Blais et al. |
| 2004/0098443 A1 | 5/2004 | Omelyanchouk et al. |
| 2004/0120299 A1 | 6/2004 | Kidiyarova-Shevchenko et al. |
| 2004/0135139 A1 | 7/2004 | Koval et al. |
| 2004/0140537 A1 | 7/2004 | Il'ichev et al. |
| 2004/0145366 A1 | 7/2004 | Baudenbacher et al. |
| 2004/0154704 A1 | 8/2004 | Schultz et al. |
| 2004/0155237 A1* | 8/2004 | Kerber .......................... 257/31 |
| 2004/0159863 A1 | 8/2004 | Eldridge et al. |
| 2004/0160830 A1 | 8/2004 | Forbes |
| 2004/0164342 A1 | 8/2004 | Forbes et al. |
| 2004/0167036 A1 | 8/2004 | Amin et al. |
| 2004/0170047 A1 | 9/2004 | Amin et al. |
| 2004/0173787 A1 | 9/2004 | Blais et al. |
| 2004/0173792 A1 | 9/2004 | Blais et al. |
| 2004/0173793 A1 | 9/2004 | Blais et al. |
| 2004/0183065 A1 | 9/2004 | Kerber |
| 2004/0186023 A1 | 9/2004 | Kang et al. |
| 2004/0198610 A1 | 10/2004 | Weinstein |
| 2004/0201099 A1 | 10/2004 | Herr |
| 2004/0232406 A1 | 11/2004 | Weiss et al. |
| 2004/0232912 A1 | 11/2004 | Tsukamoto et al. |
| 2004/0234785 A1 | 11/2004 | Liu et al. |
| 2004/0266209 A1 | 12/2004 | Hinode et al. |
| 2005/0023595 A1 | 2/2005 | Forbes et al. |
| 2005/0023602 A1 | 2/2005 | Forbes et al. |
| 2005/0062131 A1 | 3/2005 | Murduck et al. |
| 2005/0074220 A1 | 4/2005 | Rey |
| 2005/0082519 A1 | 4/2005 | Amin et al. |
| 2005/0101489 A1 | 5/2005 | Blais et al. |
| 2005/0107261 A1 | 5/2005 | Cantor et al. |
| 2005/0109879 A1 | 5/2005 | Patterson |
| 2005/0123674 A1 | 6/2005 | Stasiak et al. |
| 2005/0134262 A1 | 6/2005 | Clarke et al. |
| 2005/0137092 A1 | 6/2005 | Mester et al. |
| 2005/0149002 A1 | 7/2005 | Wang et al. |
| 2005/0149169 A1 | 7/2005 | Wang et al. |
| 2005/0162302 A1 | 7/2005 | Omelyanchouk et al. |
| 2005/0191763 A1 | 9/2005 | Aoyagi et al. |
| 2005/0197254 A1 | 9/2005 | Stasiak et al. |
| 2005/0224784 A1 | 10/2005 | Amin et al. |
| 2005/0250651 A1 | 11/2005 | Amin et al. |
| 2005/0253746 A1 | 11/2005 | Hirano et al. |
| 2005/0256007 A1 | 11/2005 | Amin et al. |
| 2005/0267000 A1 | 12/2005 | Kerber |
| 2005/0270906 A1 | 12/2005 | Ramenzoni |
| 2006/0001049 A1 | 1/2006 | Forbes |
| 2006/0002192 A1 | 1/2006 | Forbes et al. |
| 2006/0052250 A1 | 3/2006 | Schrieffer |
| 2006/0091881 A1 | 5/2006 | Clarke et al. |
| 2006/0093861 A1 | 5/2006 | Pogrebnyakov et al. |
| 2006/0097746 A1 | 5/2006 | Amin |
| 2006/0097747 A1 | 5/2006 | Amin |
| 2006/0099336 A1 | 5/2006 | Hatono et al. |
| 2006/0102074 A1 | 5/2006 | Hatono et al. |
| 2006/0145694 A1 | 7/2006 | Oppenlander et al. |
| 2006/0147154 A1 | 7/2006 | Thom et al. |
| 2006/0148104 A1 | 7/2006 | Marini et al. |
| 2006/0176054 A1 | 8/2006 | Clarke et al. |
| 2006/0220641 A1 | 10/2006 | Pannetier et al. |

(56) References Cited

U.S. PATENT DOCUMENTS

| | | |
|---|---|---|
| 2006/0225165 A1 | 10/2006 | Maassen van den Brink et al. |
| 2006/0231886 A1 | 10/2006 | Forbes et al. |
| 2006/0234450 A1 | 10/2006 | Forbes et al. |
| 2006/0237768 A1 | 10/2006 | Forbes et al. |
| 2006/0255987 A1 | 11/2006 | Nagasawa et al. |
| 2006/0263981 A1 | 11/2006 | Forbes |
| 2006/0278917 A1 | 12/2006 | Forbes et al. |
| 2007/0018643 A1 | 1/2007 | Clarke et al. |
| 2007/0080341 A1 | 4/2007 | Macready et al. |
| 2007/0105313 A1 | 5/2007 | Forbes |
| 2007/0108437 A1 | 5/2007 | Tavkhelidze |
| 2007/0122610 A1 | 5/2007 | Hatono et al. |
| 2007/0128829 A1 | 6/2007 | Kawakami |
| 2007/0174227 A1 | 7/2007 | Johnson et al. |
| 2007/0180586 A1 | 8/2007 | Amin |
| 2007/0194225 A1 | 8/2007 | Zorn |
| 2007/0194958 A1 | 8/2007 | Kirichenko et al. |
| 2007/0197900 A1 | 8/2007 | Baudenbacher et al. |
| 2007/0241747 A1 | 10/2007 | Morley et al. |
| 2007/0263432 A1 | 11/2007 | Pertti et al. |
| 2007/0285843 A1 | 12/2007 | Tran |
| 2008/0048902 A1 | 2/2008 | Rylov et al. |
| 2008/0052055 A1 | 2/2008 | Rose et al. |
| 2008/0065573 A1 | 3/2008 | Macready |
| 2008/0070325 A1 | 3/2008 | Tolpygo |
| 2008/0074113 A1 | 3/2008 | Clarke et al. |
| 2008/0086438 A1 | 4/2008 | Amin et al. |
| 2008/0096007 A1 | 4/2008 | Hatono et al. |
| 2008/0109500 A1 | 5/2008 | Macready et al. |
| 2008/0116449 A1 | 5/2008 | Macready et al. |
| 2008/0162613 A1 | 7/2008 | Amin |
| 2008/0176750 A1 | 7/2008 | Rose et al. |
| 2008/0197285 A1 | 8/2008 | Frey et al. |
| 2008/0213377 A1 | 9/2008 | Bhatia et al. |
| 2008/0215850 A1 | 9/2008 | Berkley et al. |
| 2008/0218519 A1 | 9/2008 | Coury et al. |
| 2008/0231353 A1 | 9/2008 | Filippov et al. |
| 2008/0238531 A1 | 10/2008 | Harris |
| 2008/0258753 A1 | 10/2008 | Harris |
| 2008/0260257 A1 | 10/2008 | Rose |
| 2008/0272302 A1 | 11/2008 | Frey et al. |
| 2008/0274898 A1 | 11/2008 | Johnson et al. |
| 2008/0296351 A1 | 12/2008 | Crockett et al. |
| 2008/0296354 A1 | 12/2008 | Crockett et al. |
| 2008/0313114 A1 | 12/2008 | Rose |
| 2008/0313430 A1 | 12/2008 | Bunyk |
| 2009/0008632 A1 | 1/2009 | Bunyk et al. |
| 2009/0008789 A1 | 1/2009 | Watanabe et al. |
| 2009/0020701 A1 | 1/2009 | Frey |
| 2009/0057375 A1 | 3/2009 | Crockett et al. |
| 2009/0057652 A1 | 3/2009 | Nevirkovets et al. |
| 2009/0070402 A1 | 3/2009 | Rose et al. |
| 2009/0072009 A1 | 3/2009 | Crockett et al. |
| 2009/0075825 A1 | 3/2009 | Rose et al. |
| 2009/0077001 A1 | 3/2009 | Macready et al. |
| 2009/0078931 A1 | 3/2009 | Berkley |
| 2009/0078932 A1 | 3/2009 | Amin |
| 2009/0082209 A1 | 3/2009 | Bunyk et al. |
| 2009/0086533 A1 | 4/2009 | Kirichenko et al. |
| 2009/0102580 A1 | 4/2009 | Uchaykin |
| 2009/0121215 A1 | 5/2009 | Choi |
| 2009/0122508 A1 | 5/2009 | Uchaykin et al. |
| 2009/0127460 A1 | 5/2009 | Frey |
| 2009/0153381 A1 | 6/2009 | Kirichenko |
| 2009/0167342 A1 | 7/2009 | van den Brink et al. |
| 2009/0168286 A1 | 7/2009 | Berkley et al. |
| 2009/0173936 A1 | 7/2009 | Bunyk |
| 2009/0192041 A1 | 7/2009 | Johansson et al. |
| 2009/0233798 A1 | 9/2009 | Maeda et al. |
| 2009/0315021 A1 | 12/2009 | Tolpygo |
| 2009/0319757 A1 | 12/2009 | Berkley |
| 2010/0026537 A1 | 2/2010 | Kirichenko |
| 2010/0033266 A1 | 2/2010 | U-Yen et al. |
| 2010/0066576 A1 | 3/2010 | Kirichenko |
| 2010/0085827 A1 | 4/2010 | Thom et al. |
| 2010/0097056 A1 | 4/2010 | Lam et al. |
| 2010/0102904 A1 | 4/2010 | Kusmartsev et al. |
| 2010/0133514 A1 | 6/2010 | Bunyk et al. |
| 2010/0168404 A1 | 7/2010 | Girolami et al. |
| 2010/0207622 A1 | 8/2010 | Finkler et al. |
| 2010/0285969 A1 | 11/2010 | Agassi et al. |
| 2010/0306142 A1 | 12/2010 | Amin |
| 2011/0010412 A1 | 1/2011 | Macready et al. |
| 2011/0031994 A1 | 2/2011 | Berkley |
| 2011/0047201 A1 | 2/2011 | Macready et al. |
| 2011/0054876 A1 | 3/2011 | Biamonte et al. |
| 2011/0055520 A1 | 3/2011 | Berkley et al. |
| 2011/0057169 A1 | 3/2011 | Harris et al. |
| 2011/0060710 A1 | 3/2011 | Amin |
| 2011/0060711 A1 | 3/2011 | Macready et al. |
| 2011/0060780 A1 | 3/2011 | Berkley et al. |
| 2011/0065585 A1 | 3/2011 | Lanting et al. |
| 2011/0065586 A1 | 3/2011 | Maibaum et al. |
| 2011/0089405 A1 | 4/2011 | Ladizinsky et al. |
| 2011/0148441 A1 | 6/2011 | Yamamoto et al. |
| 2011/0152104 A1 | 6/2011 | Farinelli et al. |
| 2011/0163455 A1 | 7/2011 | Gaidis |
| 2011/0167241 A1 | 7/2011 | Kirichenko et al. |
| 2011/0175061 A1 | 7/2011 | Berkley et al. |
| 2011/0183853 A1 | 7/2011 | Thom et al. |
| 2011/0238607 A1 | 9/2011 | Coury et al. |
| 2011/0267878 A1 | 11/2011 | Herr et al. |
| 2011/0287944 A1 | 11/2011 | Folk et al. |
| 2011/0288823 A1 | 11/2011 | Gupta |
| 2011/0298489 A1 | 12/2011 | van den Brink et al. |
| 2012/0005456 A1 | 1/2012 | Berkley et al. |
| 2012/0023053 A1 | 1/2012 | Harris et al. |
| 2012/0045136 A1 | 2/2012 | Rose |
| 2012/0094838 A1 | 4/2012 | Bunyk et al. |
| 2012/0098594 A1 | 4/2012 | Zmuidzinas et al. |
| 2012/0133050 A1 | 5/2012 | Gaidis |
| 2012/0135867 A1 | 5/2012 | Thom et al. |
| 2012/0172233 A1 | 7/2012 | Uchaykin |
| 2012/0215821 A1 | 8/2012 | Macready et al. |
| 2012/0219824 A1 | 8/2012 | Prolier et al. |
| 2012/0225411 A1 | 9/2012 | Puente |
| 2012/0254586 A1 | 10/2012 | Amin et al. |
| 2012/0278057 A1 | 11/2012 | Biamonte et al. |
| 2013/0007087 A1 | 1/2013 | van den Brink et al. |
| 2013/0119351 A1 | 5/2013 | Shea et al. |
| 2013/0122722 A1 | 5/2013 | Cissell et al. |
| 2013/0129593 A1 | 5/2013 | Girolami et al. |
| 2013/0157864 A1 | 6/2013 | Talvacchio et al. |
| 2013/0190185 A1 | 7/2013 | Chavez |
| 2013/0217580 A1 | 8/2013 | Thom et al. |
| 2013/0313526 A1 | 11/2013 | Harris et al. |

\* cited by examiner

DOUBLE-MASKING TECHNIQUE FOR INCREASING FABRICATION YIELD IN SUPERCONDUCTING ELECTRONICS

CROSS REFERENCE TO RELATED APPLICATIONS

This application is a Continuation of Ser. No. 13/073,954, filed Mar. 28, 2011, issued Feb. 26, 2013 as U.S. Pat. No. 8,383,426, which is a Continuation of Ser. No. 12/346,603, filed Dec. 30, 2008, which is a Continuation of Ser. No. 11/616,382, filed Dec. 27, 2006, now U.S. Pat. No. 7,615,385, which are each expressly incorporated herein by reference. This application is related to and claims priority to Provisional Application 60/826,262 filed Sep. 20, 2006 by inventor Sergey K. Tolpygo entitled A Double-Masking Technique for Increasing Fabrication Yield and Josephson Junction Quality in Superconducting Electronics, the contents of which is incorporated herein by reference in its entirety.

STATEMENT OF GOVERNMENT RIGHTS

This invention was developed in part under contract number N0014-03-C-0370 from the Office of Naval Research. The government has certain rights in this invention.

BACKGROUND OF THE INVENTION

1. Field of the Invention

The invention is directed to fabrication of electronic devices and more particularly to the fabrication of superconducting electronic devices such as Josephson junctions.

2. Description of the Prior Art

Superconducting integrated circuits (ICs) based on Josephson junctions offer the possibility of operation at clock frequencies of 100 GHz or above. In order to achieve this on an industrial scale, it is necessary to decrease junction size toward submicron dimensions, and increase junction density, so that chips with many thousands of Josephson junctions can be reliably manufactured. The key parameter is the critical current $I_c$ of a junction, which must be defined to within about 1% of design specifications, without defects.

The most reliable junction fabrication technology is based on the superconductor niobium (Nb), and in particular on a trilayer structure based on an ultrathin insulating "tunnel barrier" layer of aluminum oxide ($AlO_x$), 1-2 nm thick, sandwiched between two layers of Nb. This provides a precise critical current density of the junction $J_c=I_c/A$, where A is the junction area. If the microlithography defines A accurately, without damaging the tunnel barrier layer, then $I_c$ is also accurately defined. This becomes increasingly difficult as the dimensions of the junction decrease. Applications of standard microlithography techniques may produce junctions with edge damage that can reduce junction quality and yield.

Current Nb IC technology also incorporates multiple layers of superconducting Nb wiring to bias and connect the Josephson junctions. This requires high-quality insulating layers between Nb layers, which are typically provided by silicon dioxide ($SiO_2$). $SiO_2$ is of course a standard material in semiconductor technology, and standard procedures for fabricating high-quality films are available.

An established technique in the prior art to improve junction yield is the use of selective anodization (Meng 2003, Kerber 2006). Anodization is an electrolytic process of surface oxidation that passivates all exposed Nb and Al surfaces, preventing damage in subsequent lithographic steps. However, this has not completely eliminated defects and related yield problems. It is essential to solve these problems to advance to the next stage of circuit integration.

Problems of the Prior Art

As indicated above, the techniques of the prior art have resulted in a number of problems. Specifically, the techniques of the prior art have resulted in low yield, that is, a large number of junctions fabricated on a silicon based wafer fail for a variety of reasons. This results in a substantial percentage of defective junctions on each wafer.

Sometimes part of a junction will simply peel off the wafer upon which it is fabricated, due in part to local stresses that result from the anodization procedure. Further, the prior art does not allow precise control of critical current densities of a junction. Yet another problem stems from the fact that the standard process includes a wet-etching step to remove the anodized AlOx layer, which also limits device yield.

BRIEF SUMMARY OF THE INVENTION

Maintaining ideal adhesion between layers is essential for microlithographic control, and is especially critical during the selective anodization step of junction definition. During this step, penetration of the anodization solution (the electrolyte) under the resist would cause major fabrication defects. Standard resists have been optimized for the semiconductor industry, where the most critical materials are Si and $SiO_2$, and adhesion of resists to these materials is outstanding. In contrast, no such optimization exists for Nb, the key material for superconducting circuits. In the present invention (see FIG. 2), a thin layer of $SiO_2$ is used as an adhesion layer in a double-layer mask for defining the area of Josephson junctions. The $SiO_2$ adheres well to Nb (since it has also been optimized for an insulation layer), and also adheres very well to the top resist layer. Furthermore, $SiO_2$ is inert with respect to both aqueous and organic solvents used in anodization processing and resist processing (for both positive and negative resists), but can also be removed where necessary by standard etching techniques.

The invention recognizes that failure of interlayer adhesion between photoresist and Nb is a major cause of defects in the fabrication technology of the prior art. By substantially improving such adhesion, the present invention offers the possibility of improved reliability and IC yield.

In the prior art, the very same photoresist mask had to survive two subsequent fabrication steps—etching and self-aligned junction anodization (passivation) without loss of adhesion. The new technique is more robust in this respect since the bottom layer of the double-layer would prevent defect formation during anodization even if the top (resist) layer fails. This technique has been incorporated into a complete IC process, and indeed has resulted in substantially improved IC yield, especially for the smallest junctions (below 1.5 microns size) where the problems had previously been the most severe.

The present invention does increase the number of steps in the full process, since the $SiO_2$ layer in the mask must first be deposited, and subsequently etched away. (However, this etch-away step can be done simultaneously with the counter-electrode etching.) Nevertheless, this extra effort is easily worthwhile, since it enables the manufacturing (with reasonable yield) of higher-density superconducting ICs with greatly enhanced device speed and performance.

A second process improvement of the present invention replaces a wet-etch process for $AlO_x$ removal in the prior art with an optimized dry-etch (or argon ion mill) process, in order to enhance junction uniformity and yield for small junctions.

A detailed description of a preferred embodiment of the invention, including a step-by-step process with fabrication parameters, is shown below.

DETAILED DESCRIPTION OF THE INVENTION

A new fabrication method is proposed for increasing the yield and quality of superconducting junctions and more particularly Josephson junctions and Josephson-based digital and analog circuits in superconducting electronics. The method is based on using a double-layer mask for partial anodization of the junction side-walls and base-electrode around the junction. The top layer of this mask is a photoresist or electron-beam resist, and the bottom layer is a dielectric (e.g., SiO$_2$) that is insoluble in either aqueous or organic solvents. A more detailed description will now be given.

Figure 1:
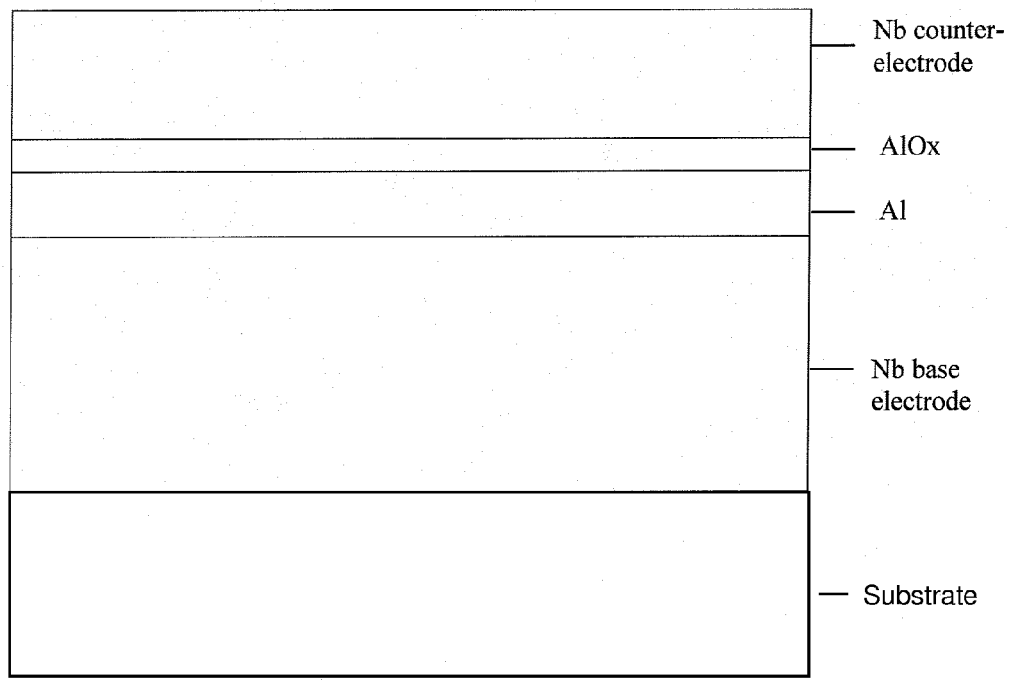
FIG. 1 shows a cross section of a wafer having Nb/Al/ AlO$_x$/Nb layers as used in the fabrication of superconducting devices such as a Josephson junction.

The existing fabrication scheme for making Nb-based Josephson tunnel junctions for superconducting electronics is comprised of the following fabrication steps:

1. As shown in FIG. 1, a Nb/Al/AlO$_x$/Nb trilayer is deposited in-situ on a wafer that includes or will include several other patterned layers of metal and dielectric. A tunnel barrier is formed by in-situ thermal oxidation of the Al layer in oxygen or an oxygen/argon mixture at a defined pressure, to form a thin (~1-2 nm) layer of AlO$_x$. Both the oxidation time and the pressure determine the properties of the tunnel barrier such as the Josephson critical current density J$_c$. The bottom Nb layer is called the base electrode, and the top Nb layer is called the counter-electrode of the tunnel Josephson junctions.

Figure 2:
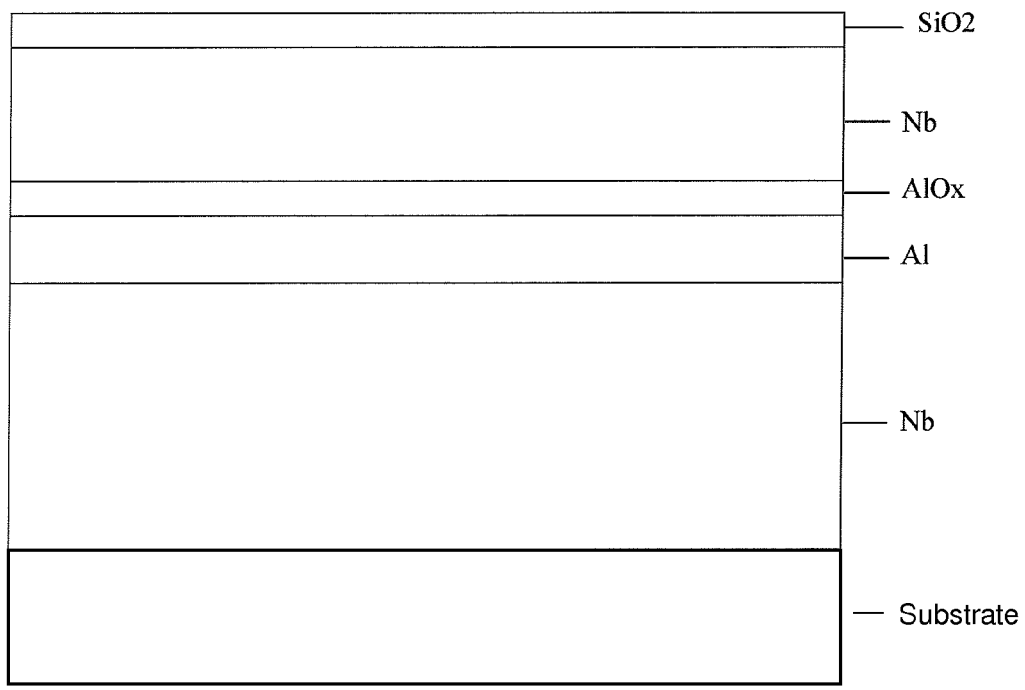
FIG. 2 shows a modification of the prior art process whereby dielectric layer of SiO$_2$ is deposited to act as an adhesion layer between the Nb and the photoresist layer deposited during the next process step.

2. FIG. 2 shows a step that differs from prior art fabrication techniques and will be discussed in more detail hereinafter.

Figure 3:
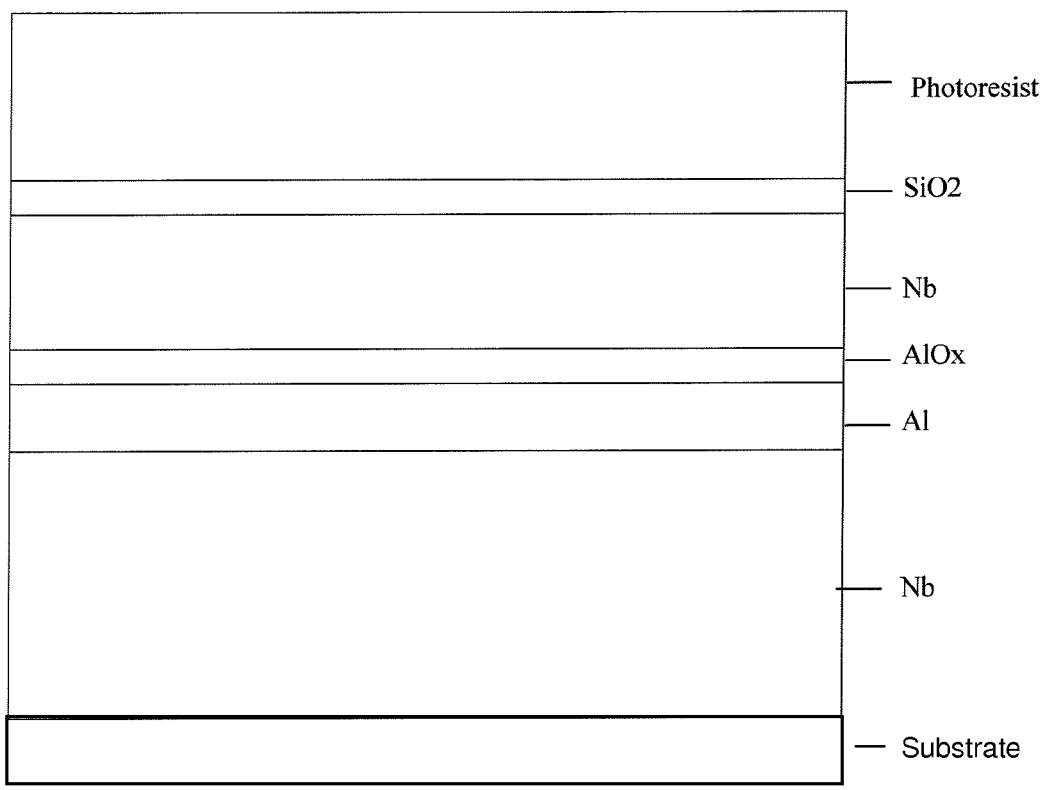
FIG. 3 shows application of a photoresist layer on top of the silicon dioxide layer in accordance with one aspect of the invention.
Figure 4:
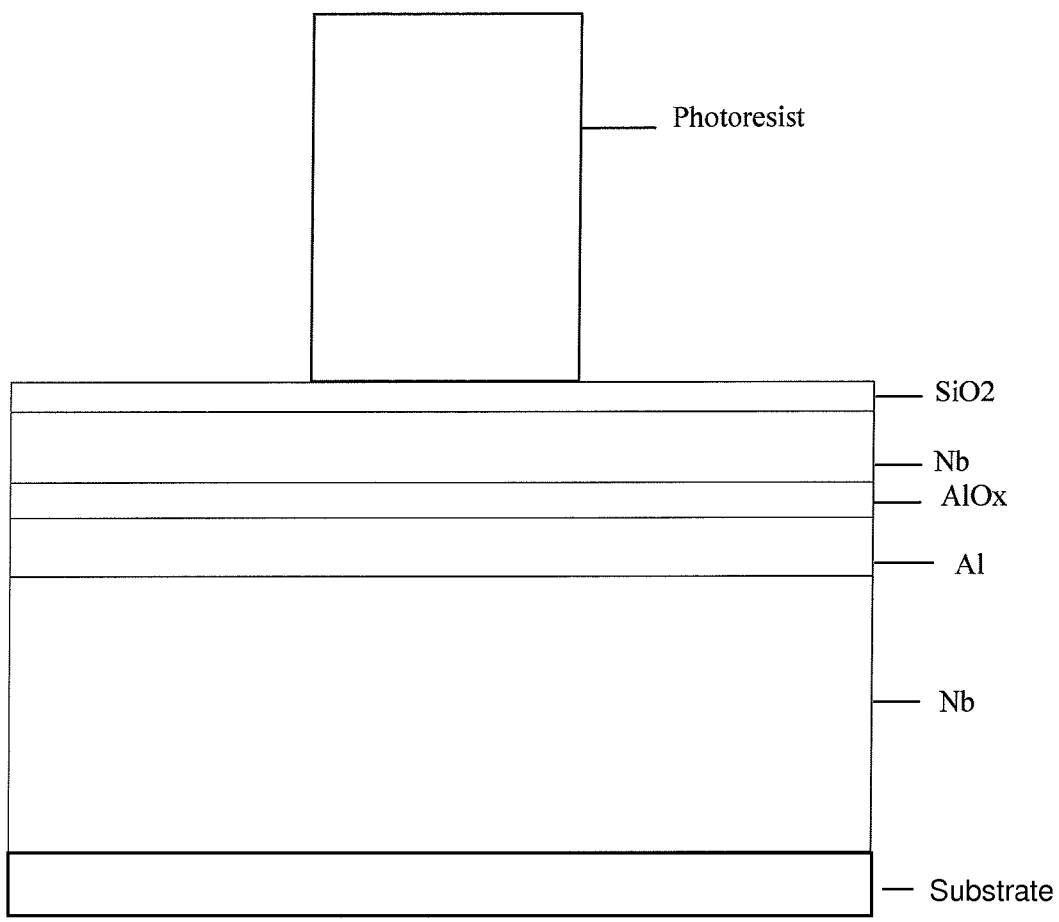
FIG. 4 shows the photoresist area that defines the junction area after exposure and development of the photoresist.
Figure 5:
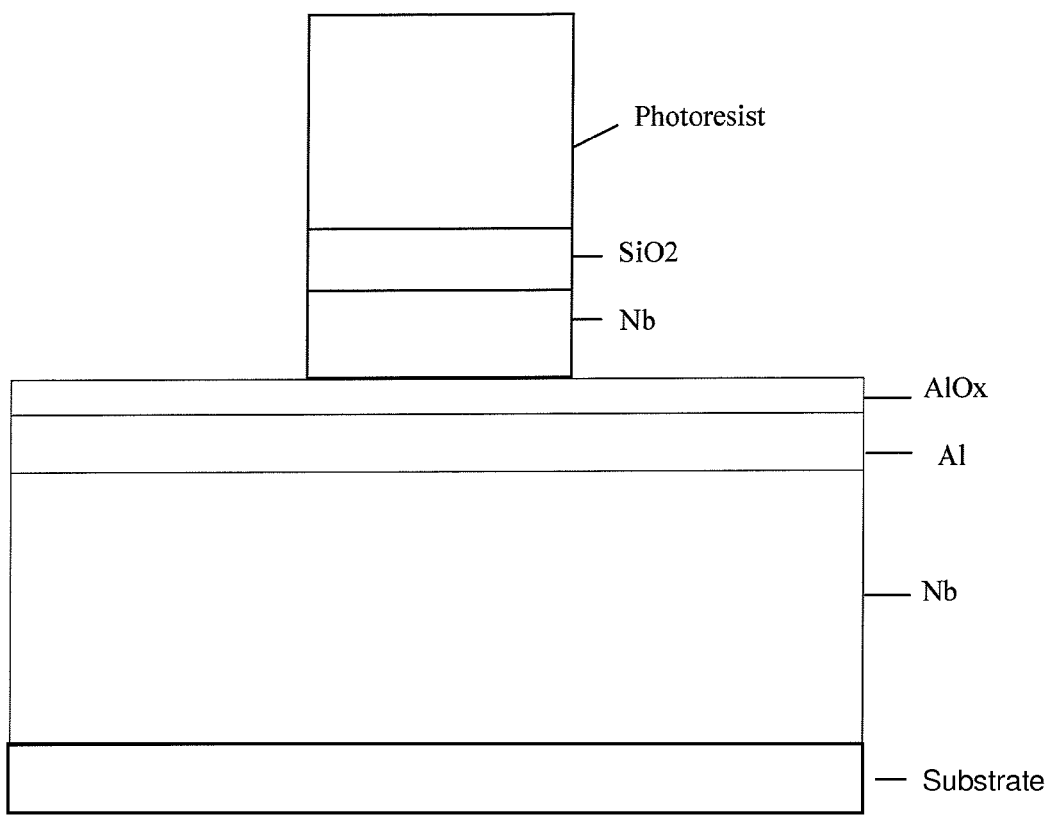
FIG. 5 shows the etching of the SiO$_2$ adhesion layer and Nb counter-electrode down to the AlO$_x$/Al barrier layer.

3. The wafer is coated with either positive or negative resist (FIG. 3), and the resist etch mask is formed by optical or e-beam lithography (FIG. 4). The counter-electrode area is then defined by etching (FIG. 5), using e.g. plasma etching, reactive-ion etching, or high-density plasma etching. The AlO$_x$/Al layer acts as an etch stop. (Note—the prior art method does not include the thin SiO$_2$ layer shown in FIGS. 3, 4 and 5.)

Figure 6A:
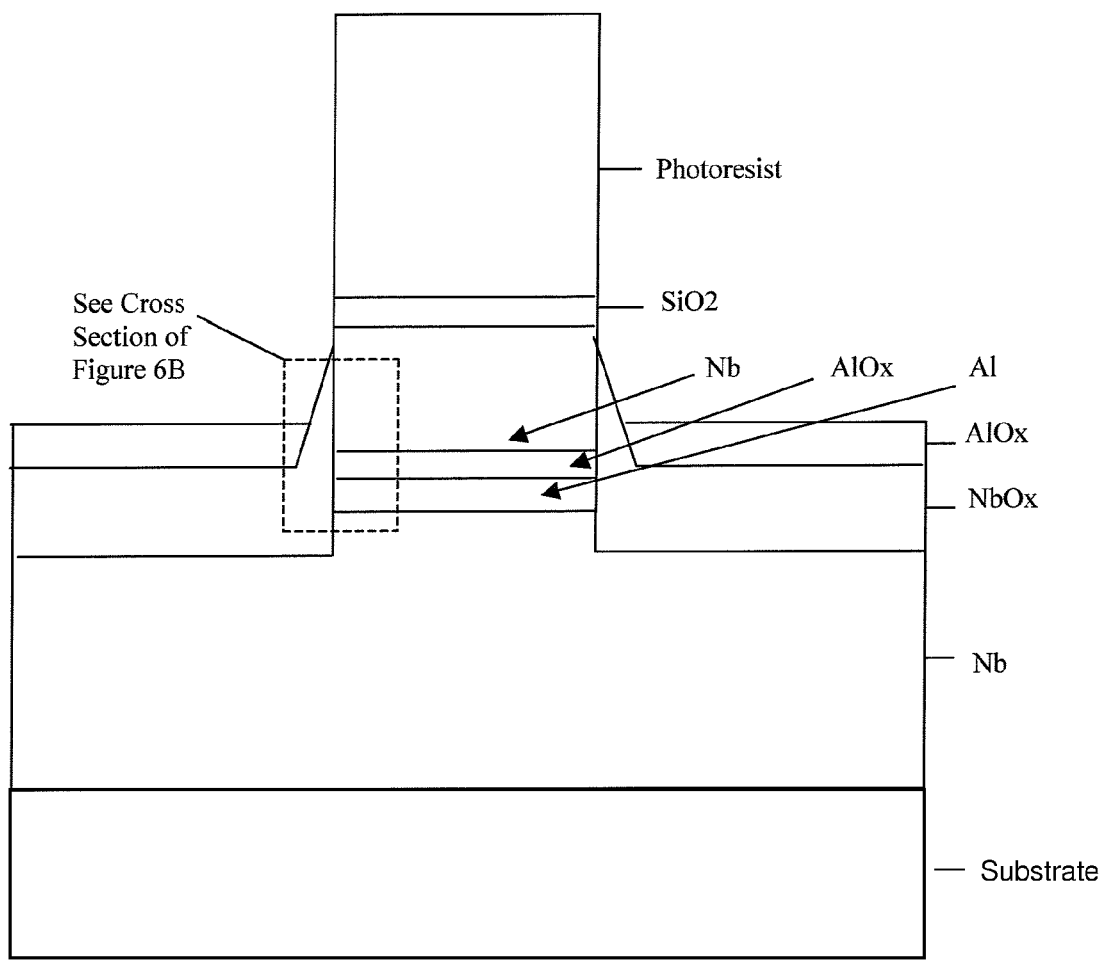
FIG. 6A shows the results of a selective anodization step whereby all the exposed Al and part of the underlying Nb are converted to insulating oxides.
Figure 6B:
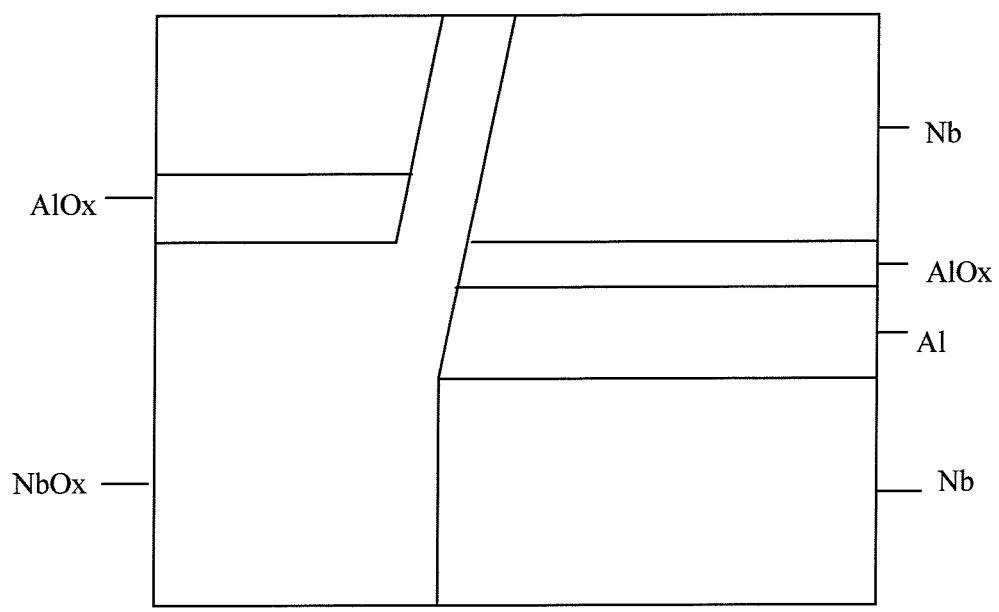
FIG. 6B shows a magnified view of the region inside the small dashed box in FIG. 6A.

4. After etching and without removing the resist, the wafer is immersed in an anodization solution, and all the surfaces that are not protected by the resist mask formed in step 5 are anodized. That is, the same resist etch mask is also used as an anodization mask. Anodization creates a bilayer of anodized Al (AlO$_x$) and anodized Nb (NbO$_x$) on the surface of the base electrode (FIG. 6). A layer of anodized Nb is also formed on all sidewalls of the junction's counter-electrode. This anodization step is very important because it encapsulates the junction's tunnel barrier with an anodized NbO$_x$ layer, and this, protects it from reacting with water, oxygen, and other processing chemicals during all further wafer processing steps. This step also allows for opening a contact hole to the counter-electrode that is larger in size than the junction itself. The thickness of the anodized layer is controlled by the anodization voltage, usually in the range of 15-50 V. The initial anodization current density is in the range from 0.5-5 mA/cm$^2$.

Figure 7:
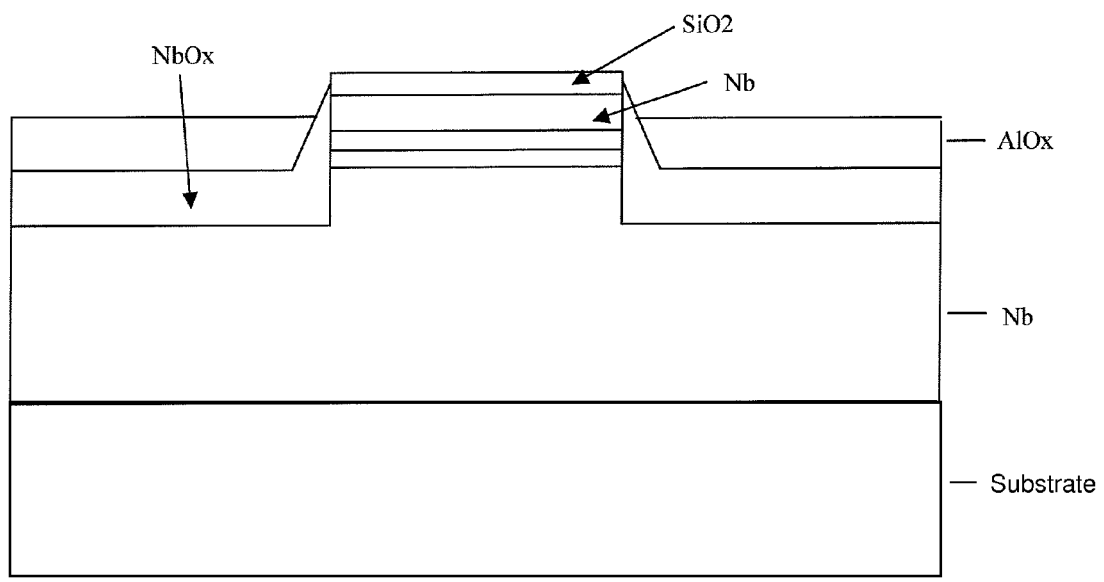
FIG. 7 shows the removal of the photoresist layer.

5. After anodization, the resist is stripped (FIG. 7), and the wafer proceeds to the next fabrication steps that are intended to pattern the base electrode of the junction by lithography and etching. This may also require removing the anodization layer in some parts of the circuit. It remains around the junction (the anodization ring of FIGS. 8-10).

6. After base electrode patterning, the Josephson junction is completely formed. All other fabrication steps are necessary in order to interconnect junctions in the circuits (such as the SiO$_2$ insulating layer in FIGS. 11-14), and to create resistors for biasing and shunting the junctions. These steps may vary depending on the details the fabrication process.

One of the main sources of defects and loss of yield in this fabrication scheme is poor adhesion of the resist mask in step 3. Although this fact has not been recognized in the prior art. This may be due in part to the volume expansion of Nb and Al layers during anodization, which places significant local stresses on the photoresist mask. As a result, some parts of the resist mask may peel off during anodization, or anodization solutions may leach under the resist mask. This is especially a problem with many negative resists such as UVN-30. Some photoresists may also be incompatible with (partially soluble in) the common anodization solutions. In these cases, some junctions may be degraded, or the counter-electrode of some junctions may be partially anodized, thus preventing a good (superconducting) electrical contact to be made to the junctions during the following fabrication steps.

One improvement of the invention is to use a double-layer anodization mask with the lower layer being an inorganic dielectric layer (such as SiO$_2$) that is insoluble in water, solvents, and components of the anodization solution, and the upper layer is the photoresist (or e-beam resist) layer. $SiO_2$ is especially suitable since it has already been optimized as an insulating layer in the prior-art Nb integrated circuit process, and is also fully compatible with standard Si-based resist processing. This double-layer mask is formed in the following simple way:

a. After the Josephson junction trilayer (Nb/Al/$AlO_x$/Nb) is formed as in step 1 above, a pinhole-free layer of $SiO_2$ is deposited by any appropriate method (e.g., rf magnetron sputtering, or plasma-enhanced chemical vapor deposition—PECVD) on top of the trilayer (see FIG. 2). The layer thickness may be anywhere from 5 to 300 nm, and is not critical, as long as it is free from pinholes. Thicker layers require long etch times, making them impractical.

b. A resist mask is formed in the same way as in step 4 above.

c. Then etching is done, using reactive ion etching (ME) or inductively coupled plasma (ICP) with fluorine-based chemistry (e.g., $SF_6$, $NF_3$, or $CF_4+O_2$) such that both the $SiO_2$ overlayer and the Nb counter-electrode are etched in the same process. This may be a one-step process when the same etch parameters are used for both layers, or a two-step process when different etch recipes are used for etching first the $SiO_2$ and then the Nb counter-electrode. After completing the etch down to the $AlO_x$/Al layer in the trilayer structure (FIG. 5), the top of the Josephson junction will have a double-layer structure ($SiO_2$+resist) that serves as the double-layer anodization mask.

d. Etching is immediately followed by the anodization step 3, without removing the resist mask (FIG. 6). Now there is a layer of $SiO_2$ under the resist mask for extra protection.

The advantages of the proposed method are as follows. The $SiO_2$ layer improves the adhesion of the resist, and does not allow the anodization solution to leach underneath. Since the adhesion of sputtered or PECVD-deposited $SiO_2$ to Nb has already been optimized, and is stronger than the adhesion of the resist to Nb, the double-layer also protects the junction counter-electrode from being anodized even in the unlikely event that a part of the resist mask pops off, or if the anodization solution does leach under the resist. In the rare case that the $SiO_2$ layer has a pinhole or other defect, the presence of the resist on top still provides protection during the anodization. The probability that both layers of the double-layer anodization mask fail in the same location is much smaller than the probability of a failure of a single-layer resist mask. As a result, a dramatic increase in the yield and junction quality is achieved.

Figure 8:
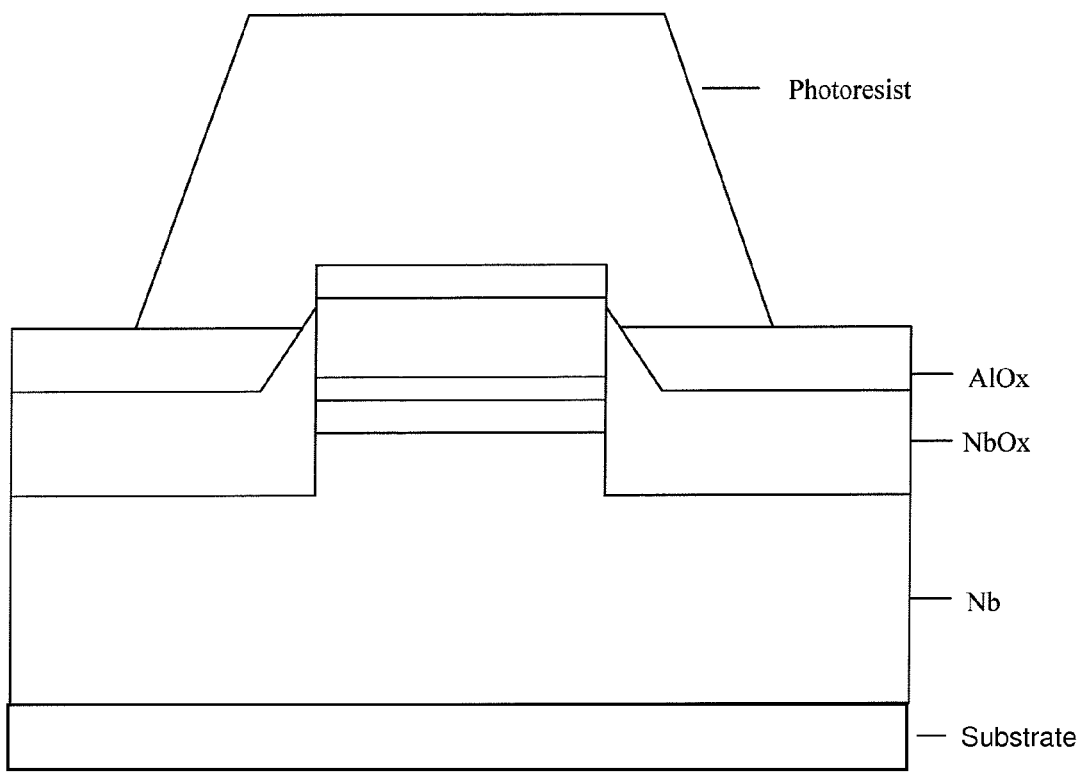
FIG. 8 shows the result of coating and patterning of another photoresist layer designed to produce a protective anodization ring around the junction area.
Figure 9:
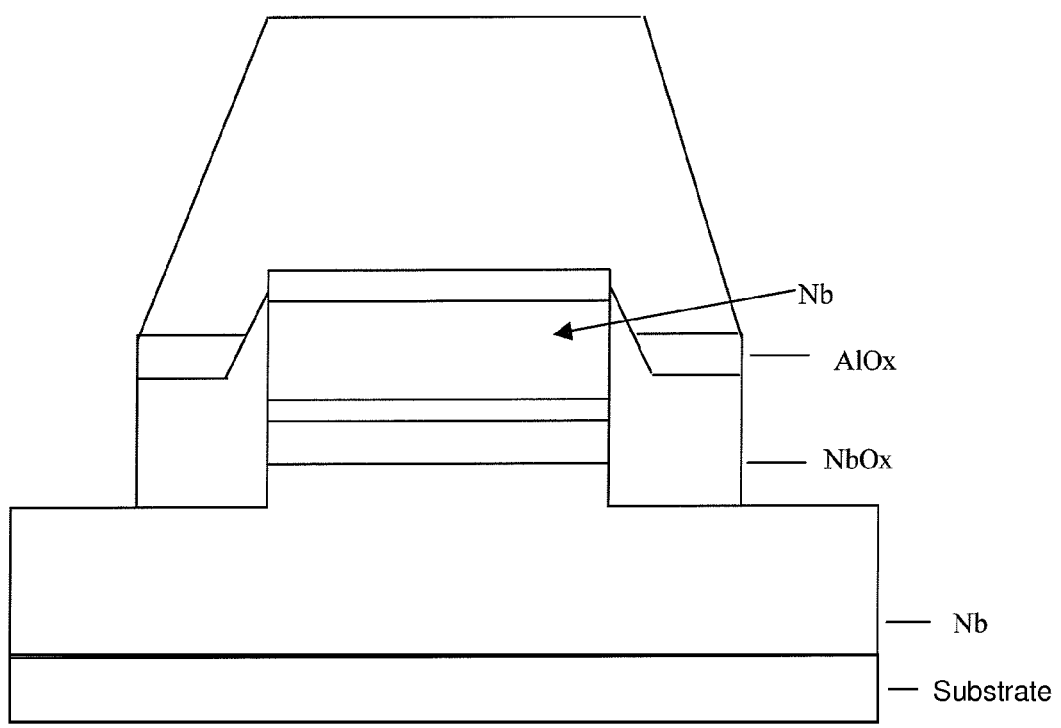
FIG. 9 shows the etching (by Ar ion milling or dry reactive ion etching) of the anodized oxide (both AlO$_x$ and NbO$_x$ layers) except in the anodization ring (under the photoresist mask)
Figure 10:
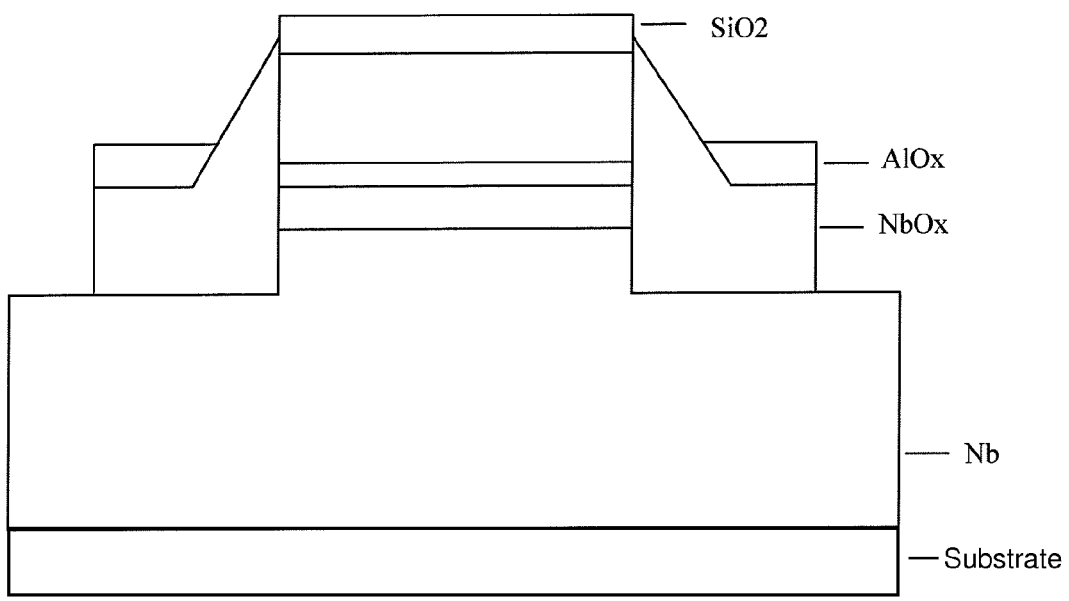
FIG. 10 shows the removal of the photoresist defining the anodization ring.
Figure 11:
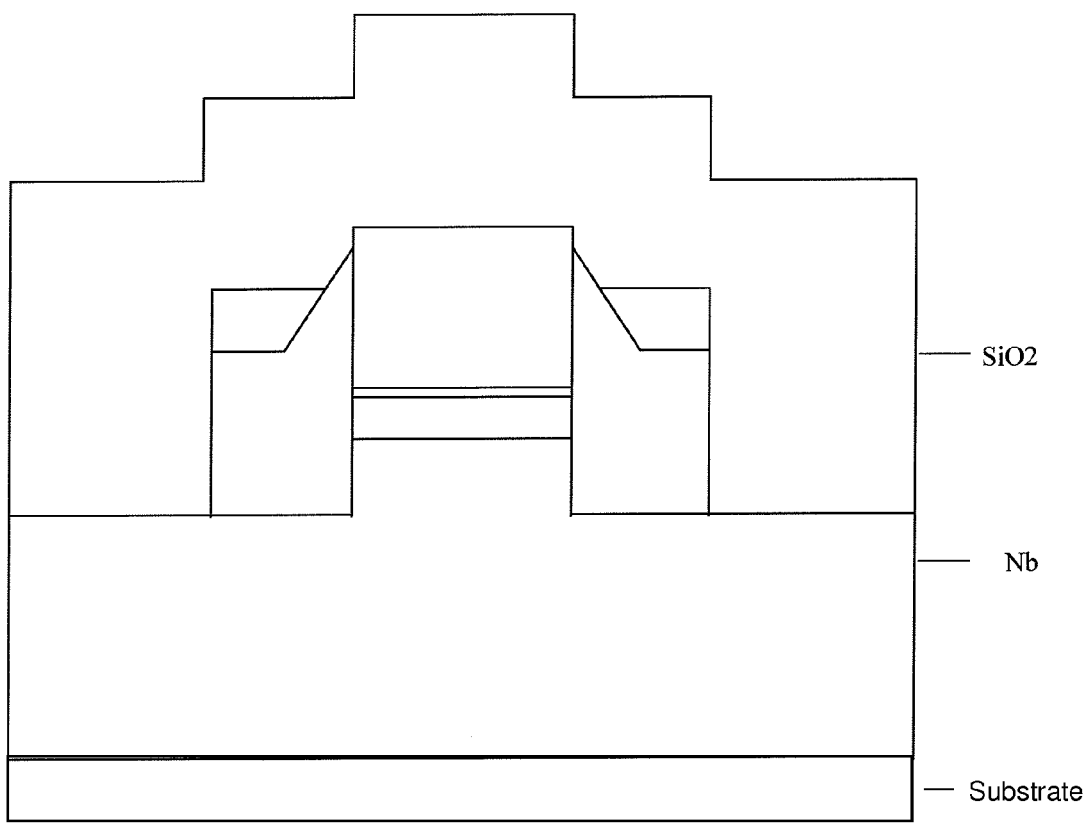
FIG. 11 shows the deposition of an SiO$_2$ insulating layer, designed to isolate the junction from subsequent wiring layers.
Figure 12:
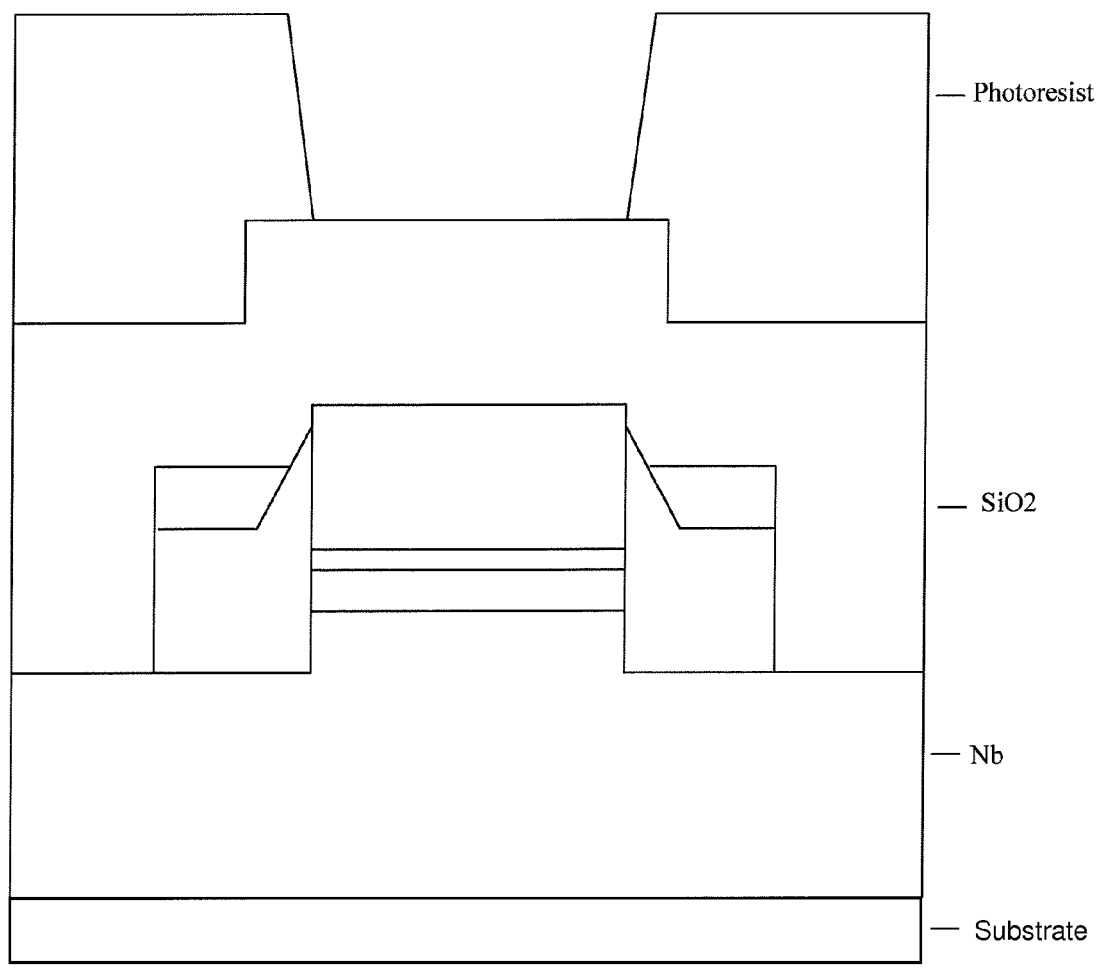
FIG. 12 shows the coating and patterning of a third photoresist layer, designed to produce a contact via to the Nb junction from a Nb wiring layer.
Figure 13:
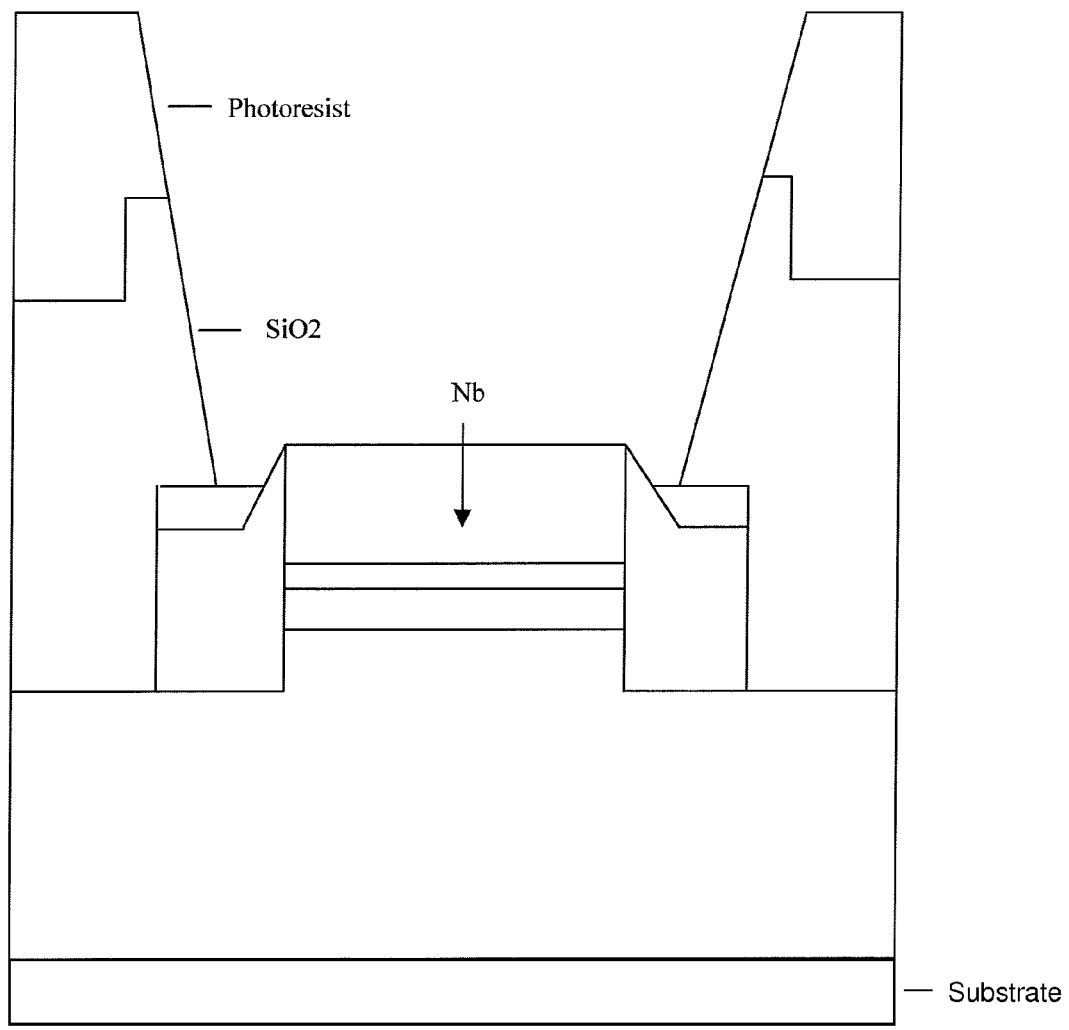
FIG. 13 shows the selective etching of the SiO$_2$ up to the Nb counter-electrode.
Figure 14:
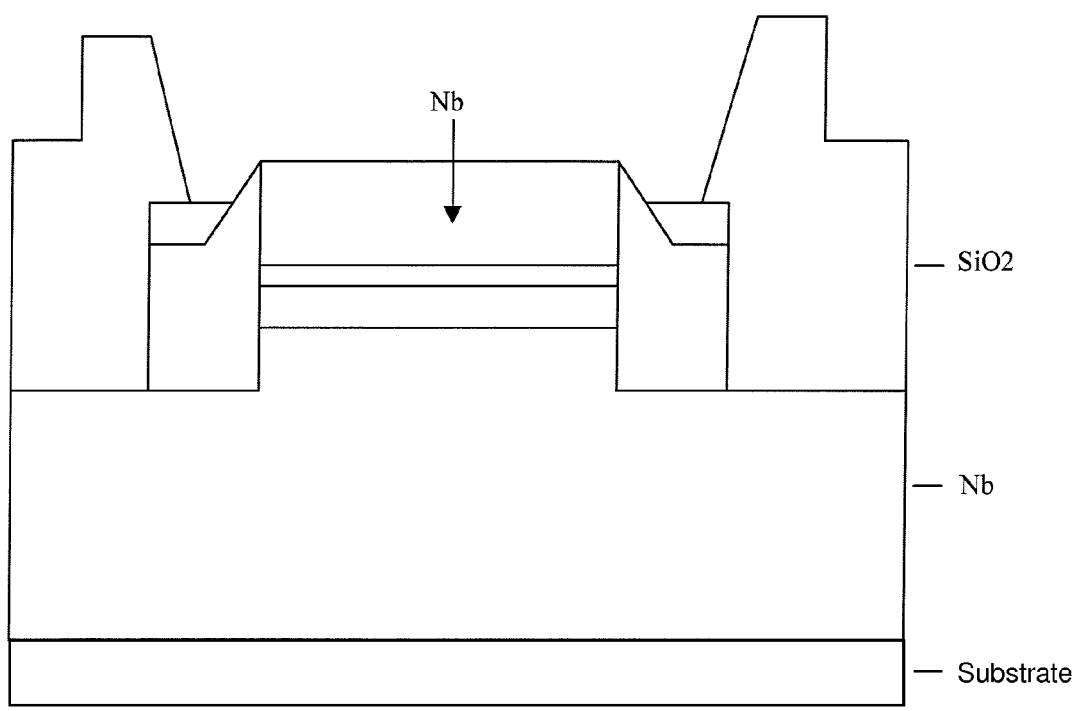
FIG. 14 shows the removal of the photoresist. Now the structure is ready for deposition of a Nb wiring layer

Another improvement over the prior art is described in reference to FIGS. 8 and 9, in defining the anodization ring around the Josephson junction. In the prior art, the $AlO_x$ layer was first removed by a wet etch process, followed by reactive ion etching (ME) for removing the $NbO_x$ layer. However, a wet etch process can cause problems, that should preferably be avoided in high-reliability VLSI processing, particularly if sub-micron resolution is required. In the process of the present invention, this wet etch step is discarded, and two new approaches have been successfully demonstrated. In approach A, ion-milling with a neutral beam of argon (Ar) atoms is used to remove both the $AlO_x$ and the $NbO_x$ layers. In approach B, plasma etching (ME or ICP) is used in a two-step process. First, a chlorine-based plasma is used to remove $AlO_x$, and then a fluorine-based plasma is used to remove the $NbO_x$. Either approach provides for increased yield and uniformity.

While various embodiments of the present invention have been illustrated herein in detail, it should be apparent that modifications and adaptations to those embodiments may occur to those skilled in the art without departing from the scope of the present invention as set forth in the following claims.

What is claimed is:

1. An integrated circuit having Josephson junctions, comprising:
a Josephson junction trilayer comprising an upper superconductor, an insulating layer, and a lower superconductor, the insulating layer being between the upper superconductor and the lower superconductor;
an adhesion layer formed directly on top of the upper superconductor; and
a resist layer formed directly on top of the adhesion layer, the resist being patterned and developed, exposing portions of the adhesion layer through the patterned and developed resist layer, and the exposed portions of the adhesion layer being etched through the upper superconductor layer to expose the insulating layer; and
portions of the lower superconducting layer under the exposed portions of the insulating layer being anodized to selectively form Josephson junction circuit elements having submicron feature sizes under remaining portions of the adhesion layer and the resist layer, wherein the anodized portions of the lower superconductor form a layer of anodized superconductor on all sidewalls of the upper superconductor and insulating layer, and undergo a volumetric increase with respect to the non-anodized portions under remaining portions of the resist layer, the volumetric increase causing local stresses which are insufficient to cause substantial peeling of the resist layer on the adhesion layer and are sufficient to cause peeling of at least a portion of the resist layer directly on the upper superconductor adjacent to the anodized portions of the lower superconductor layer.

2. The integrated circuit according to claim 1, wherein the adhesion layer comprises silicon dioxide.

3. The integrated circuit according to claim 1, wherein the resist is patterned with submicron resolution.

4. The integrated circuit according to claim 1, wherein the Josephson junction trilayer comprises a niobium-based superconductor.

5. The integrated circuit according to claim 1, wherein the Josephson junction trilayer comprises a lower layer of niobium, an insulating layer comprising aluminum oxide, and an upper layer of niobium.

6. The integrated circuit according to claim 1, wherein the adhesion layer comprises a dielectric.

7. The integrated circuit according to claim 1, wherein the resist comprises at least one of an electron beam exposed resist and a photoresist.

8. The integrated circuit according to claim 1, wherein the adhesion layer is formed by chemical vapor deposition with a layer thickness of between about 5-300 nm.

9. The integrated circuit according to claim 1, wherein the adhesion layer is formed by a sputtering process with a layer thickness of between about 5-300 nm.

10. The integrated circuit according to claim 1, wherein the Josephson junction circuit elements comprise at least two separately operating Josephson junctions.

11. An integrated circuit having Josephson junctions, comprising:
a Josephson junction trilayer comprising an upper superconductor, an intervening insulating layer, and a lower superconductor;
an adhesion layer formed directly on top of the upper superconductor;

a resist layer formed directly on top of the adhesion layer, the resist being patterned and developed, exposing portions of the adhesion layer through the patterned and developed resist layer, and the exposed portions of the adhesion layer being etched through the upper superconductor layer to expose the insulating layer; and portions of the lower superconducting layer beneath the exposed portions of the insulating layer being anodized, to selectively form Josephson junction circuit elements having submicron features size under remaining intact portions of the adhesion layer and the resist layer and having a layer of anodized superconductor on all sidewalls of the upper superconductor layer and insulating layer, wherein the anodized portions of the lower superconductor are volumetrically increased with respect to the non-anodized portions under remaining intact portions of the resist layer, to induce stresses in the adhesion layer and the resist layer adjacent to the anodized portions, wherein the resist layer is susceptible to a failure of adhesion and peeling under the induced stresses if applied directly to the upper superconductor, and the adhesion layer formed between the resist layer and the upper superconductor being effective to substantially prevent peeling of the resist layer from the stresses, such that adjacent portions of the adhesion layer or resist layer to the anodized portions of the lower superconductor layer remain substantially without peeling, the exposed portions of the insulating layer and the anodized portions of the lower superconductor layer being removed to expose the lower superconductor layer.

12. The integrated circuit according to claim 11, wherein the lower superconductor of the Josephson junction trilayer is formed on a silicon substrate and the adhesion layer comprises silicon dioxide.

13. The integrated circuit according to claim 11, wherein the Josephson junction circuit elements comprise at least two separately operating Josephson junctions having submicron feature sizes.

14. The integrated circuit according to claim 11, wherein the Josephson junction trilayer comprises a niobium-based superconductor.

15. The integrated circuit according to claim 1, wherein the Josephson junction trilayer comprises a lower layer of niobium, an insulating layer comprising aluminum oxide, and an upper layer of niobium.

16. The integrated circuit according to claim 1, wherein the adhesion layer comprises a dielectric and the resist comprises at least one of an electron beam exposed resist and a photoresist.

17. The integrated circuit according to claim 1, wherein the adhesion layer is formed by chemical vapor deposition or sputtering with a layer thickness of between about 5-300 nm.

18. An integrated circuit having Josephson junctions, comprising:
a Josephson junction trilayer comprising an upper superconductor, an intervening insulating layer, and a lower superconductor;
an adhesion layer directly on top of the upper superconductor;
a patterned and developed resist layer directly on top of the adhesion layer, exposing portions of the insulating layer through etched portions of the adhesion layer corresponding to absent portions of the patterned and developed resist layer, wherein portions of the lower superconducting layer beneath the exposed portions of the insulating layer have a volumetric increase as a result of selective anodization, forming a layer of anodized superconductor on all sidewalls of the upper superconductor and intervening insulating layer, and Josephson junction circuit elements under remaining intact portions of the adhesion layer and the resist layer, portions of the adhesion layer or resist layer adjacent to the anodized portions of the lower superconductor layer being locally stressed from the selective anodization and being substantially unpeeled, formed by a process comprising:

providing a substrate, having the Josephson junction trilayer thereon, the upper superconducting layer being directly covered by an intermediate layer comprising a dielectric having a thickness of at least 5 nm, which in turn is directly covered by a resist layer;

selectively patterning portions of the resist layer in dependence on an irradiation pattern, and developing the patterned portions of the resist layer to expose portions of the intermediate layer;

etching the exposed portions of the intermediate layer and underlying portions of the upper superconducting layer, substantially without removing remaining portions of the resist layer, to expose the insulating layer, to thereby form a bilayer anodization mask comprising the resist layer and the intermediate layer; and anodizing the exposed insulating layer and underlying lower superconducting layer through the bilayer mask, to cause a volumetric increase in at least a portion of the lower superconducting layer sufficient to form the layer of anodized superconductor on all sidewalls of the upper superconductor and intervening insulating layer, and to selectively form Josephson junction circuit elements having a submicron feature size comprising intact portions of the Josephson junction trilayer having a submicron feature size protected by the bilayer mask, the volumetric increase causing stresses in the remaining portions of the resist layer and the intermediate layer local to the anodizing, the resist layer being subject to a failure of adhesion and peeling under the stresses if applied directly to the upper superconductor and the intermediate layer formed between the resist layer and the Josephson junction trilayer being effective to substantially prevent peeling of the resist layer, wherein the resist layer remains strongly adherent to the intermediate layer, and the intermediate layer remains strongly adherent to the upper superconducting layer, substantially without peeling.

19. The integrated circuit according to claim 18, wherein the intermediate layer comprises silicon dioxide, the resist layer is strongly adherent to silicon dioxide, and at least the upper superconducting layer comprises a niobium based superconductor film, wherein the resist is more strongly adherent to silicon dioxide than to the niobium based superconductor film.

20. The method according to claim 18, wherein the intermediate layer is a thin layer deposited by chemical vapor deposition and is subject to pinhole defects, and wherein the resist layer covers the pinhole defects during the anodizing.

* * * * *